United States Patent
Akbulut et al.

(10) Patent No.: US 10,731,269 B2
(45) Date of Patent: Aug. 4, 2020

(54) FLEXIBLE AND COMPLIANT THERMAL INTERFACE MATERIALS WITH ULTRAHIGH THERMAL CONDUCTIVITIES

(71) Applicant: The Texas A&M University System, College Station, TX (US)

(72) Inventors: Mustafa Akbulut, College Station, TX (US); Cengiz Yegin, College Station, TX (US); Nirup K. Nagabandi, College Station, TX (US); Blake Teipel, College Station, TX (US)

(73) Assignee: THE TEXAS A&M UNIVERSITY SYSTEM, College Station, TX (US)

( * ) Notice: Subject to any disclaimer, the term of this patent is extended or adjusted under 35 U.S.C. 154(b) by 83 days.

(21) Appl. No.: 15/559,260

(22) PCT Filed: Mar. 17, 2016

(86) PCT No.: PCT/US2016/022876
§ 371 (c)(1),
(2) Date: Mar. 19, 2018

(87) PCT Pub. No.: WO2016/149500
PCT Pub. Date: Sep. 22, 2016

(65) Prior Publication Data
US 2018/0216248 A1    Aug. 2, 2018

Related U.S. Application Data

(60) Provisional application No. 62/134,912, filed on Mar. 18, 2015.

(51) Int. Cl.
*F28F 13/00*    (2006.01)
*C25D 15/00*    (2006.01)
(Continued)

(52) U.S. Cl.
CPC ............... *C25D 15/00* (2013.01); *B32B 9/00* (2013.01); *C09K 5/14* (2013.01); *C25D 3/38* (2013.01);
(Continued)

(58) Field of Classification Search
CPC ... F28F 13/00; F28F 2013/001; Y10S 977/90; Y10S 977/755; Y10S 977/778
See application file for complete search history.

(56) References Cited

U.S. PATENT DOCUMENTS 5,170,930 A    12/1992   Dolbear et al.
5,198,189 A     3/1993   Booth et al.
(Continued)

FOREIGN PATENT DOCUMENTS

CN    103203462 A    7/2013
SU      1624565 A1   1/1991

OTHER PUBLICATIONS

Stadler, Bis-acyl-/aroyl-hydrazones as multidentate ligands, 2009, Inorganica Chimica Acta, 362 (Year: 2009).*
(Continued)

*Primary Examiner* — Eric S Ruppert
(74) *Attorney, Agent, or Firm* — Vivacqua Law PLLC

(57) ABSTRACT

Inefficient dissipation of heat limits the performance of electronic devices. Thermal interface materials (TIMs) can be used in electronic devices to dissipate heat more effectively and efficiently. Nanocomposites have been prepared using functionalized boron nitride nanosheets (BNNS). The incorporation of soft-ligand functionalized BNNS in a metal matrix was used to nanofabricate kinetically-trapped nanocomposites TIMs.

16 Claims, 41 Drawing Sheets

(51) Int. Cl.
| | |
|---|---|
| C25D 3/38 | (2006.01) |
| C25D 7/00 | (2006.01) |
| H01L 23/373 | (2006.01) |
| H01L 23/42 | (2006.01) |
| B32B 9/00 | (2006.01) |
| C09K 5/14 | (2006.01) |
| H05K 7/20 | (2006.01) |
| B82Y 30/00 | (2011.01) |
| B82Y 40/00 | (2011.01) |
| H01L 23/00 | (2006.01) |

(52) U.S. Cl.
CPC ............... *C25D 7/00* (2013.01); *F28F 13/00* (2013.01); *H01L 23/3731* (2013.01); *H01L 23/3736* (2013.01); *H01L 23/42* (2013.01); *H05K 7/2039* (2013.01); *B82Y 30/00* (2013.01); *B82Y 40/00* (2013.01); *F28F 2013/001* (2013.01); *H01L 23/3733* (2013.01); *H01L 24/27* (2013.01); *H01L 24/29* (2013.01); *H01L 24/32* (2013.01); *H01L 2224/27462* (2013.01); *H01L 2224/2939* (2013.01); *H01L 2224/29209* (2013.01); *H01L 2224/29239* (2013.01); *H01L 2224/29247* (2013.01); *H01L 2224/29386* (2013.01); *H01L 2224/32245* (2013.01); *H01L 2924/1432* (2013.01); *Y10S 977/755* (2013.01); *Y10S 977/778* (2013.01); *Y10S 977/90* (2013.01); *Y10S 977/932* (2013.01)

(56) References Cited

U.S. PATENT DOCUMENTS

| | | | |
|---|---|---|---|
| 6,114,413 | A | 9/2000 | Kang et al. |
| 6,797,382 | B2 | 9/2004 | Nguyen et al. |
| 7,393,428 | B2 | 7/2008 | Huang et al. |
| 7,408,787 | B2 | 8/2008 | Matayabas, Jr. et al. |
| 2003/0068487 | A1 | 4/2003 | Nguyen et al. |
| 2004/0241447 | A1 | 12/2004 | Fukushima |
| 2005/0116387 | A1 | 6/2005 | Davison et al. |
| 2014/0374267 | A1 | 12/2014 | Monteiro et al. |
| 2018/0298154 | A1* | 10/2018 | Lundorf ............... C01B 32/156 |

OTHER PUBLICATIONS

Nebeker, Exfoliation of Hexagonal Boron Nitride Through Sonication and Centrifugation, 2012 (Year: 2012).*
Ravula, Ionic liquid-assisted exfoliation and dispersion, 2015, Nanoscale (Year: 2015).*
Cengiz Yegin, et al., Metal-Organic-Inorganic Nanocomposite Thermal Interface Materials with Ultralow Thermal Resistances, ACS Appl. Mater. Interfaces, p. 10120-10127, Feb. 27, 2017.
Kris J. Erickson, et al., Longitudinal Splitting of Boron Nitride Nanotubes for the Facile Synthesis of High Quality Boron Nitride Nanoribbons, Nano Lett. 2011, 11, p. 3221-3226, May 24, 2011.
Drazen Fabris, et al., Application of Carbon Nanotubes to Thermal Interface Materials, Journal of Electronic Packaging, vol. 133, p. 020902-1 through 020902-6, Jun. 2011.
M. Gradzielski, et al., Experimental investigation of the structure of nonionic microemulsions and their relation to the bending elasticity of the amphiphilic film, Phys Rev E Stat Phys Plasmas Fluids Relat Interdiscip Topics. Apr. 1996; 53(4):3900-3919.
Jochen Greim, et al., Boron Carbide, Boron Nitride, and Metal Borides, Ullmann's Encyclopedia of Industrial Chemistry, 2012 Wiley-VCH Verlag GmbH & Co. KGaA, Weinheim, p. 219-236.
J.P. Gwinn, et al., Performance and testing of thermal interface materials, Microelectronics Journal 34 (2003) 215-222.
Amy M. Marconnet, et al., Thermal Conduction in Aligned Carbon Nanotube Polymer Nanocomposites with High Packing Density, ACS Nano, vol. 5 No. 6, p. 4818-4825, 2011.
Nirup Nagabandi, Metallic Nanocomposites as Next Generation Thermal Interface Materials, 16th IEEE ITHERM Conference, p. 400-406, 2017.
Hai Yan Nan, et al., The thermal stability of graphene in air investigated by Raman spectroscopy, J. Raman Spectrosc. 2013, 44, 1018-1021.
Yakov I. Rabinovich, et al., Mechanical and thermodynamic properties of surfactant aggregates at the solid-liquid interface, Journal of Colloid and Interface Science 270 (2004) 29-36.
Khan M. F. Shahil, et al., Graphene—Multilayer Graphene Nanocomposites as Highly Efficient Thermal Interface Materials, Nano Lett. 2012, 12, p. 861-867.
Yunsheng Xu, et al., Carbon Nanotube Thermal Pastes for Improving Thermal Contacts, Journal of Electronic Materials, vol. 36, No. 9, 2007.
Aiping Yu,et al., Graphite Nanoplatelet-Epoxy Composite Thermal Interface Materials, J. of Phys. Chem. Lett., 2007, 111, 7565-7569.
Hui Yu, et al., Thermal and Insulating Properties of Epoxy/ Aluminum Nitride Composites Used for Thermal Interface Material, Journal of Applied Polymer Science, vol. 124, 669-677 (2012) CV 2011 Wiley Periodicals, Inc.
Zan, et al., Interaction of Metals with Suspended Graphene Observed by Transmission Electron Microscopy, J. Phys. Chem. Lett. 2012, 3, p. 953-958.
N. Nagabandi, et al., Chemically linked metal-matrix nanocomposites of boron nitride nanosheets and silver as thermal interface materials, Nanotechnology 29 (2018) 105706 (10pp).
Toby Sainsbury, et al., Oxygen Radical Functionalization of Boron Nitride Nanosheets, J. Am. Chem. Soc. 2012, 134, 18758-18771.
Toby Sainsbury, et al., Covalently Functionalized Hexagonal Boron Nitride Nanosheets by Nitrene Addition, Chem. Eur. J. 2012, 18, 10808-10812.
Cengiz Yegin, et al., Chemical Modification of High Performance Metal-based Nanocomposite Thermal Interface Materials Toward Efficient Cooling in Electronic Systems, 17th IEEE ITHERM Conference, 2018, p. 102-108.

* cited by examiner

Adipic acid dihydrazide

Terephthalic dihydrazide

Dodecandioic dihydrazide

Thiosemicarbazide

Terephthalic dihydrazide

Thiosemicarbazide

Adipic acid dihydrazide

Dodecandioic dihydrazide

High magnification image of f-BNNS in grain boundaries

Presence of f-BNNS in grain boundaries

Nanocomposite with 20 vol% f-BNNS $$\text{Thermal Diffusivity } \alpha = \frac{\lambda \text{ (Thermal Conductivity)}}{\rho \text{ (Density)} \cdot C_p \text{ (Specific Heat Capacity)}}$$

FIGURE 26A

$$\frac{1}{E_r} = \frac{1-\upsilon_i^2}{E_i} + \frac{1-\upsilon_s^2}{E_s}$$

FIGURE 27E

FLEXIBLE AND COMPLIANT THERMAL INTERFACE MATERIALS WITH ULTRAHIGH THERMAL CONDUCTIVITIES

RELATED APPLICATIONS

This application claims priority to, and incorporates by reference, U.S. Provisional Application No. 62/134,912, filed Mar. 18, 2015.

GOVERNMENT LICENSE RIGHTS

This invention was made with government support under D13AP00040 awarded by DARPA. The government has certain rights in the invention.

FIELD

The disclosure relates generally to heat dissipation. The disclosure relates specifically to thermal interface materials.

BACKGROUND

The inefficient dissipation of heat is a crucial problem that limits the reliability and performance of electronic devices. In advanced electronic applications, everything is driven by size, weight, and power considerations. As devices have become progressively smaller, more powerful, and more complex, they dissipate much larger amounts of heat. There is higher heat dissipation per unit area. Heat is dissipated to the ambient environment. The heat created can erode the device if there is not a thermal interface material between the electronic device and cooling system. Thermal materials can be used to connect the microprocessor and a heat sink. Currently, thermal greases, elastomer-based composites, and solders are the most commonly used types of thermal interface materials used for enabling the efficient dissipation of heat. Epoxies, gels, and phase change materials can also be used as thermal interface materials.

In thermal greases, thermally conductive fillers are typically dispersed in silicone, sodium silicate, or a hydrocarbon oil to form a paste. As a filler, CNT, diamond powder, silver, and copper, have been employed in current thermal grease formulations. Polymer-matrix composite thermal interface materials (TIMs) typically involve the addition of thermally conductive particles into a polymer matrix. While epoxy, polyurethane, and polyvinyl chloride have been traditionally used as polymer matrices; silver, copper, and aluminum nitride particles have been used as conductive fillers. Alumina, silicon oxide, silicon nitride, silicon carbide, boron nitride, and aluminum nitride are also possible fillers. Epoxy composite TIMs containing novel types of fillers such as graphite, graphene, and CNTs can be used. Both thermal grease and polymer-matrix composite TIMs typically have thermal conductivity values ranging from 0.5 W/m·K to 7 W/m·K. A solder thermal interface material, which is a fusable metal alloy, melts at a rather low temperature. The molten solder can flow and spread itself thinly at the interface, thereby giving rise to a high level of thermal contact conductance. The thermal conductivity of solder TIMs generally ranges from 20 to 80 W/(m·K).

While solder thermal interface materials offer high thermal conductivities and low thermal interface resistances, their relatively high stiffness make them unsuitable for use across interfaces between materials with large differences in thermal expansion coefficient due to the risk of delamination and chip cracking. Elastomer-based TIMs are more compliant, but their relatively low thermal conductivity and poor thermal transport across the boundaries between the epoxy and the surrounding materials in the system pose a significant thermal barrier to high-power operation. Thermal greases are messy and difficult to apply and remove. In addition, the excess grease can leak into the surrounding and cause a short.

Better thermal interface materials are important for including but not limited to radars, laser systems, military electronics, and consumer electronics in order to prevent overheating of the device.

SUMMARY

An embodiment of the disclosure is a thermal interface material comprising a thermal conductivity greater than 250 W/K·m and an elastic modulus value less than 20 GPa. In an embodiment, the thermal interface material comprises a plurality of boron nitride nanosheets. In an embodiment, the plurality of boron nitride nanosheets are soft-ligand functionalized. In an embodiment, the soft-ligands are at least one selected from the group comprising thiosemicarbazide, adipic acid dihydrazide, terepthalic dihydrazide, and dodecanedioic dihydrazide. In an embodiment, the plurality of boron nitride nanosheets is present in a metal matrix. In an embodiment, the metal matrix is selected from the group comprising copper, silver, or indium. In an embodiment, the metal matrix is copper.

An embodiment of the disclosure is a method of manufacturing the thermal interface material comprising incorporating a plurality of soft-ligand functionalized boron nitride nanosheets in a metal matrix using electrocodeposition. In an embodiment, the soft-ligand is selected from the group consisting of thiosemicarbazide, adipic acid dihydrazide, terepthalic dihydrazide, and dodecanedioic dihydrazide. In an embodiment, the metal matrix is selected from the group comprising copper, silver, or indium. In an embodiment, the metal matrix is copper. In an embodiment, the plurality of soft-ligand functionalized boron nitride nanosheets are dispersed in a copper matrix using electrocodeposition.

An embodiment of the disclosure is a method of using the thermal interface material comprising using the thermal interface material to cool an electronic instrument. In an embodiment, the thermal interface material dissipates heat in the electronic instrument. In an embodiment, the thermal interface material is a thermal gap filler. In an embodiment, the method further comprises coating the thermal interface material on a chip that is later placed within the electronic instrument.

An embodiment of the disclosure is a system comprising the thermal interface material comprising a heat generating electronic instrument and a heat dissipating thermal interface material. In an embodiment, the heat dissipating thermal interface material comprises a plurality of boron nitride nanosheets. In an embodiment, the plurality of boron nitride nanosheets are soft ligand functionalized.

An embodiment of the disclosure is a kit comprising the thermal interface material above.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

In order that the manner in which the above-recited and other enhancements and objects of the disclosure are obtained, a more particular description of the disclosure briefly described above will be rendered by reference to specific embodiments thereof which are illustrated in the appended drawings. Understanding that these drawings depict only typical embodiments of the disclosure and are therefore not to be considered limiting of its scope, the disclosure will be described with additional specificity and detail through the use of the accompanying drawings in which:

FIG. 26A depicts an equation to determine thermal diffusivity.

FIG. 27E depicts an equation showing the relationship of the reduced modulus $E_r$ to Young's modulus $E_s$ of the test specimen. The subscript i is a property of the indenter tip material and v is Poisson's ratio ($v_i$ for the indenter tip and $v_s$ for the specimen).

DETAILED DESCRIPTION

Figure 1:
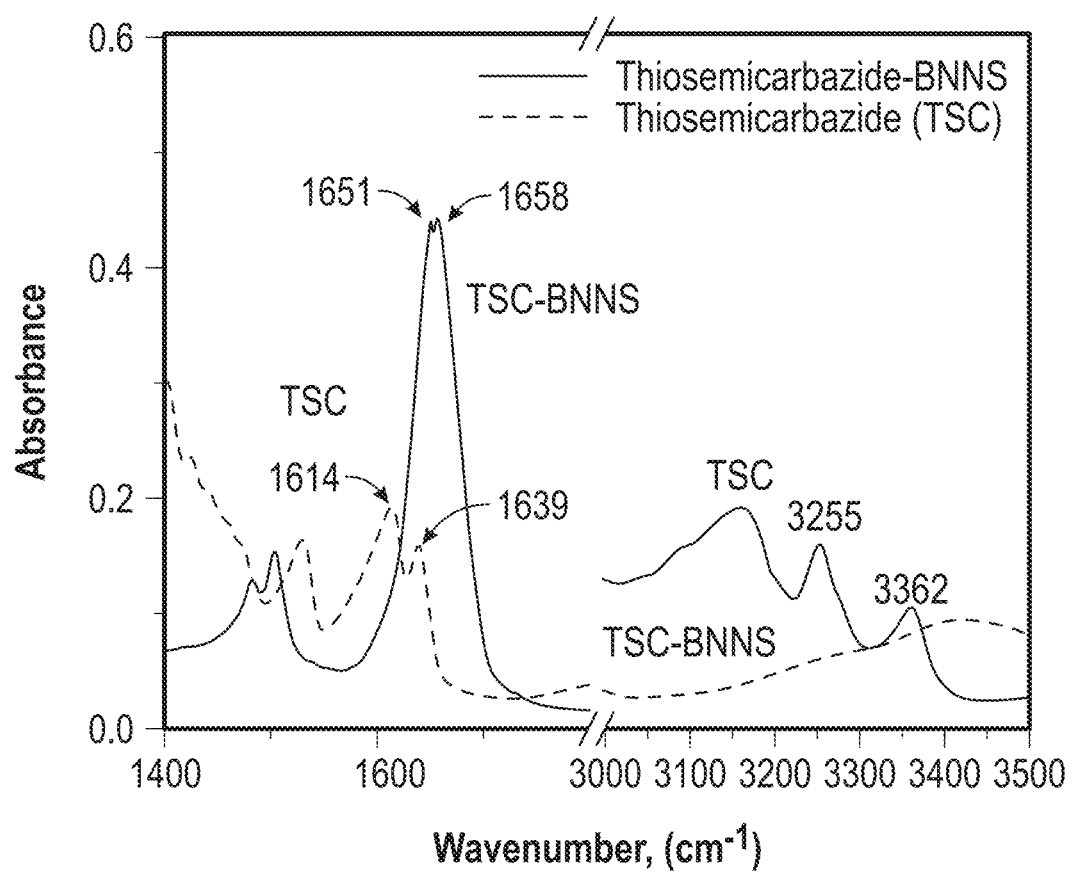
FIG. 1 depicts FTIR Spectra of pure thiosemicarbazide and thiosemicarbazide functionalized BN nanosheets.

The particulars shown herein are by way of example and for purposes of illustrative discussion of the preferred embodiments of the present disclosure only and are presented in the cause of providing what is believed to be the most useful and readily understood description of the principles and conceptual aspects of various embodiments of the disclosure. In this regard, no attempt is made to show structural details of the disclosure in more detail than is necessary for the fundamental understanding of the disclosure, the description taken with the drawings making apparent to those skilled in the art how the several forms of the disclosure can be embodied in practice.

The following definitions and explanations are meant and intended to be controlling in any future construction unless clearly and unambiguously modified in the following examples or when application of the meaning renders any construction meaningless or essentially meaningless. In cases where the construction of the term would render it meaningless or essentially meaningless, the definition should be taken from Webster's Dictionary 3$^{rd}$ Edition.

As used herein, the term "electrocodeposition" means and refers to coating a material with at least two other materials utilizing electricity.

As used herein, the term "nanosheets" means and refers to a two-dimensional nanostructure with a thickness of 1 to 100 nm.

As used herein, the term "nanoribbons" means and refers to a strip-shaped nanostructure.

As used herein, the term "nanoindentation" means and refers to a variety of indentation hardness tests applied to small volumes.

As used herein, the term "nanocomposite" means and refers to a multiphase solid material where one of the phases has a dimension of less than 100 nanometers.

The developed materials provide thermal management, very efficient heat transfer across interfaces, and cooling of electronic devices and processors.

In the electronics industry, the power density in the devices is ever increasing with higher utility and smaller packaging. Thermal interface materials (TIMs) can be used in equipment to dissipate heat more effectively and efficiently where high power densities are a problem and lead to failure of the device. Thermal interface materials can be used in all applications where fast heat transfer rate is needed. It also can be used as an alternative for thermal gap fillers in necessary applications. They can be coated directly on the chip and hence reduce additional resistance. Thermal interface materials are commercially useful in electronic devices and can be manufactured as advanced material and in all electronic instruments.

Modern day electronics have higher and higher computing power which results in more heat but with decreasing or same chip sizes. This creates an increased power density which leads to inefficient function of the device due to excess heating and thus eventually leading to failure. TIMs will be instrumental for being able to pack devices in smaller closures and keep reliable performance without failure due to the amount of heat. Creation of higher computing electronics devices without failure due to heat in present day sizes or smaller sizes will be possible. This will help to create reliable high performance military devices and so every day devices with smaller sizes or higher computing performances.

The thermal conductivities were found to be in between 210±17 W/m·K and 277±14 W/m·K which are measured using a laser flash (DLF) system and nanoindentation results suggested the average $E_r$ values were ranged from 19.07 GPa to 45.25 GPa for a filler loading ranging from 35 vol % to 2 vol %, respectively. As desired, these values are much smaller than that of the electroplated pure copper thin films (85-125 GPa). The Youngs' Modulus values varied from 10.82 Gpa to 18.58 GPa for same range of loading and against compared to electroplated pure copper values of 60 GPa. There was roughly a five-fold decrease in the reduced modulus of copper matrix when copper matrix was loaded with 20 vol % functionalized boron nitride nanosheets (BNNS). The average hardness value corresponding to this sample was 250 MPa, which is about five times lower than the measured hardness values of electroplated pure copper (1.42 GPa).

In an embodiment, silver or indium metal matrices can be used. In another embodiment, the ligand functionalization can be with different dithiol ligands to further reduce the thermal resistance or improve the mechanical reliability of these nanocomposites.

In an embodiment, the item is made of copper, silver, or indium, hexagonal boron nitride nanosheets, or thiosemicarbazide, and 4-cyanobenzoyl chloride.

In an embodiment, next-generation thermal interface materials with thermal resistivities lower than existing solder TIMs and with stiffness comparable with existing epoxy-based TIMs are utilized. The TIMs have superior ability to transfer heat and a strong capacity to keep cool. Soft materials are malleable and can cover caps or openings. The approach has involved the incorporation of soft-ligand functionalized BNNS in a metal matrix to nanofabricate kinetically-trapped nanocomposites TIMs. These show thermal conductivity values of 240-290 W/m-k with mechanical properties very close to epoxy base that is used commercially, enabling them to be used all kinds of materials and situations without risk or crack or fuse. This also lets the loading to be taken at several pressure without break or losing properties. This result in total bulk thermal resistance of 1.6-2.8×10$^{-3}$ K·cm$^2$/W which is an order of magnitude lower than commercially available TIMs which are generally in the range of 18-650×10$^{-3}$ K·cm$^2$/W.

FIG. 1 depicts FTIR Spectra of pure thiosemicarbazide and thiosemicarbazide functionalized BN nanosheets. The disappearance of peak at 1614 cm$^{-1}$ and the shift of the peak at 1639 cm–1 to 1655 cm–1 is attributed to the cleavage of thio amide groups and reaction of carbon atom with defective nitrogen atoms in BNNS.

Figure 2:
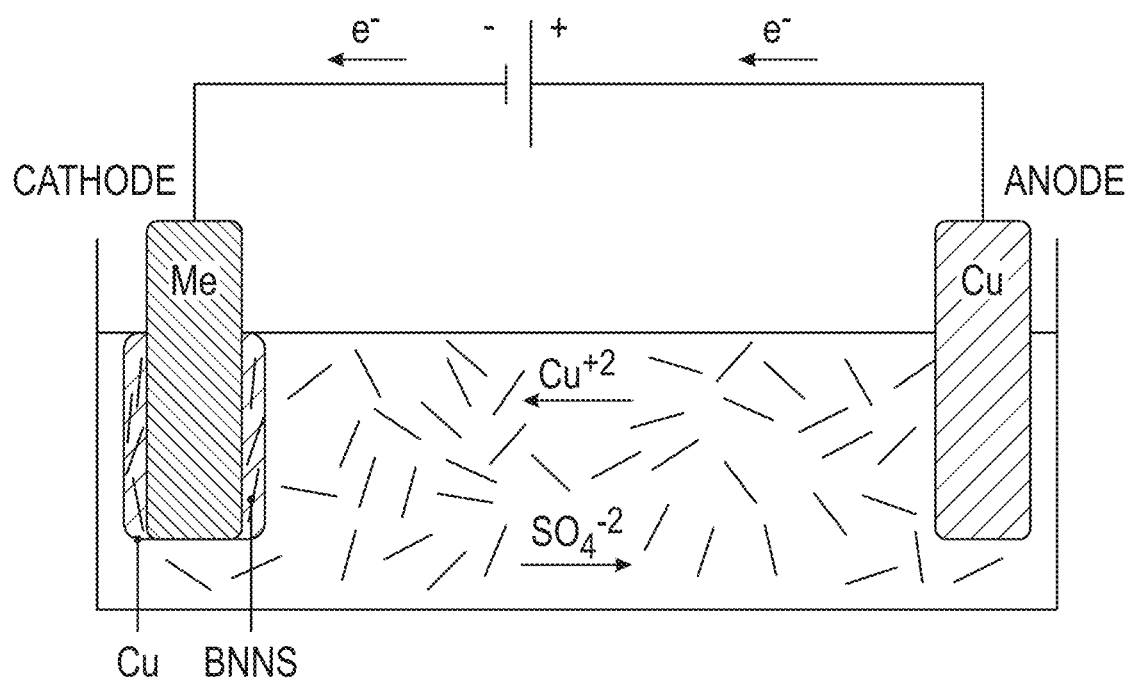
FIG. 2 depicts an experimental setup used for creating nanocomposites involving metal matrix and BN nanosheets.

FIG. 2 depicts an experimental setup used for creating nanocomposites involving metal matrix and BN nanosheets. Other essential components of solution are $H_2SO_4$, which facilitates the electron transport across the solution, and N-methyl-2-pyrrolidone (NMP), which assist the dispersion of BN nanosheets in the solution.

Figure 3:
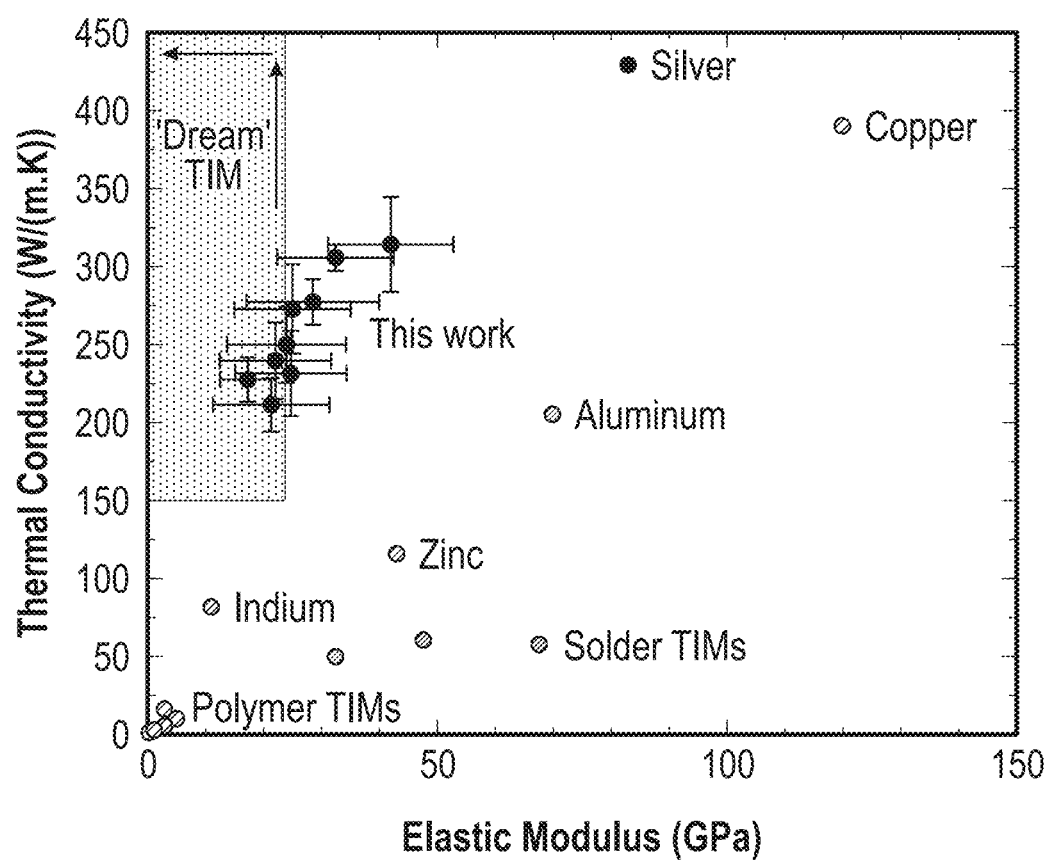
FIG. 3 depicts an overall plot summarizing and comparing thermal and mechanical properties of the developed TIMs with epoxy- and solder-based TIMs and copper-shim TIMs.

FIG. 3 depicts an overall plot summarization and comparison of thermal and mechanical properties of the developed TIMs with epoxy- and solder-based TIMs and copper-shim TIMs.

The filler, BNNS, was prepared by the mechanically assisted cleavage of h-BN flakes through ultrasonication in dimethylformamide. The size and thickness of the nanosheets can be adjusted via varying the sonication intensity, time, and temperature. The prepared BNNS was functionalized with thiosemicarbazide through Lewis acid-base interactions to form functionalized BNNS (f-BNNS), existence of which was confirmed using IR spectroscopy (FIG. 1). Then, f-BNNS was dispersed in a copper matrix using a novel electrocodeposition approach where copper and f-BNNS are deposited on a cathode in the presence of an electric field and potential difference to form nanocomposite TIMs (FIG. 2).

The thermal properties of the nanocomposite TIMs were investigated using the laser flash analysis and modulated differential scanning calorimetry (DSC). The specific heat capacity of nanocomposite ranged from 0.27±0.01 J/g·K to 0.46±0.01 J/g·K for a filler loading ranging from 2 vol % to 35 vol % (not respectively). The thermal conductivities were found to be in between 210±17 W/m·K and 277±14 W/m·K.

Upon determining thermal properties of the developed TIMs, the mechanical properties of the TIMS were studied using a nanoindentation technique. The average $E_r$ values were ranged from 19.07 GPa to 45.25 GPa for a filler loading ranging from 35 vol % to 2 vol %, respectively. As desired, these values are much smaller than that of the electroplated pure copper thin films (99-125 GPa). The Youngs' Modulus values varied from 10.82 GPa to 18.58 GPa for the same range of loading and compared to electroplated pure copper values of 60 GPa. There was roughly a five-fold decrease in the reduced modulus of copper matrix when the copper matrix was loaded with 20 vol % functionalized BNNSs. The average hardness value corresponding to this sample was 250 MPa, which is about five-to-fifteen times lower than the measured hardness values of pure copper (1.42 GPa).

Using an electrocodeposition approach, nanocomposites with thermal conductivities greater than 250 W/K·m and elastic modulus values less than 20 GPa can be produced. For these materials, the total resistance across the interface was estimated to be $1.6\text{-}2.8\times10^{-3}$ cm²·K/W for a bond-line thickness of 20-50 μm. This is confirmed by NREL thermal resistivity tests which measure $1\text{-}4\times10^{-3}$ cm²·K/W for a bondline thickness of 40 μm. Thermal and mechanical properties of epoxy-based TIMs and pure copper shim TIMs are shown in FIG. 3.

When two nominally flat surfaces come together at a typical material interface, the solid-solid contact area is limited to 1-2% of the apparent contact area due to surface asperities.

Figure 4:
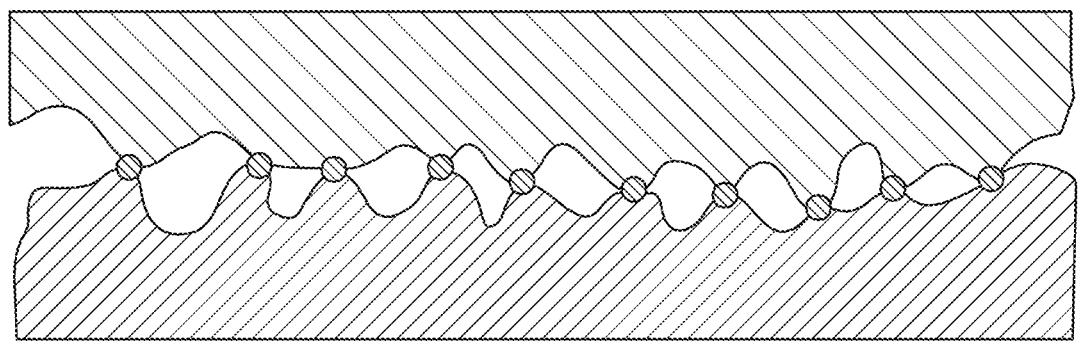
FIG. 4 depicts a typical contact between a heat sink and electronic component in the absence of thermal interface materials.

FIG. 4 depicts the contact surface between a heat sink and electronic component in the absence of thermal interface materials.

Figure 5:
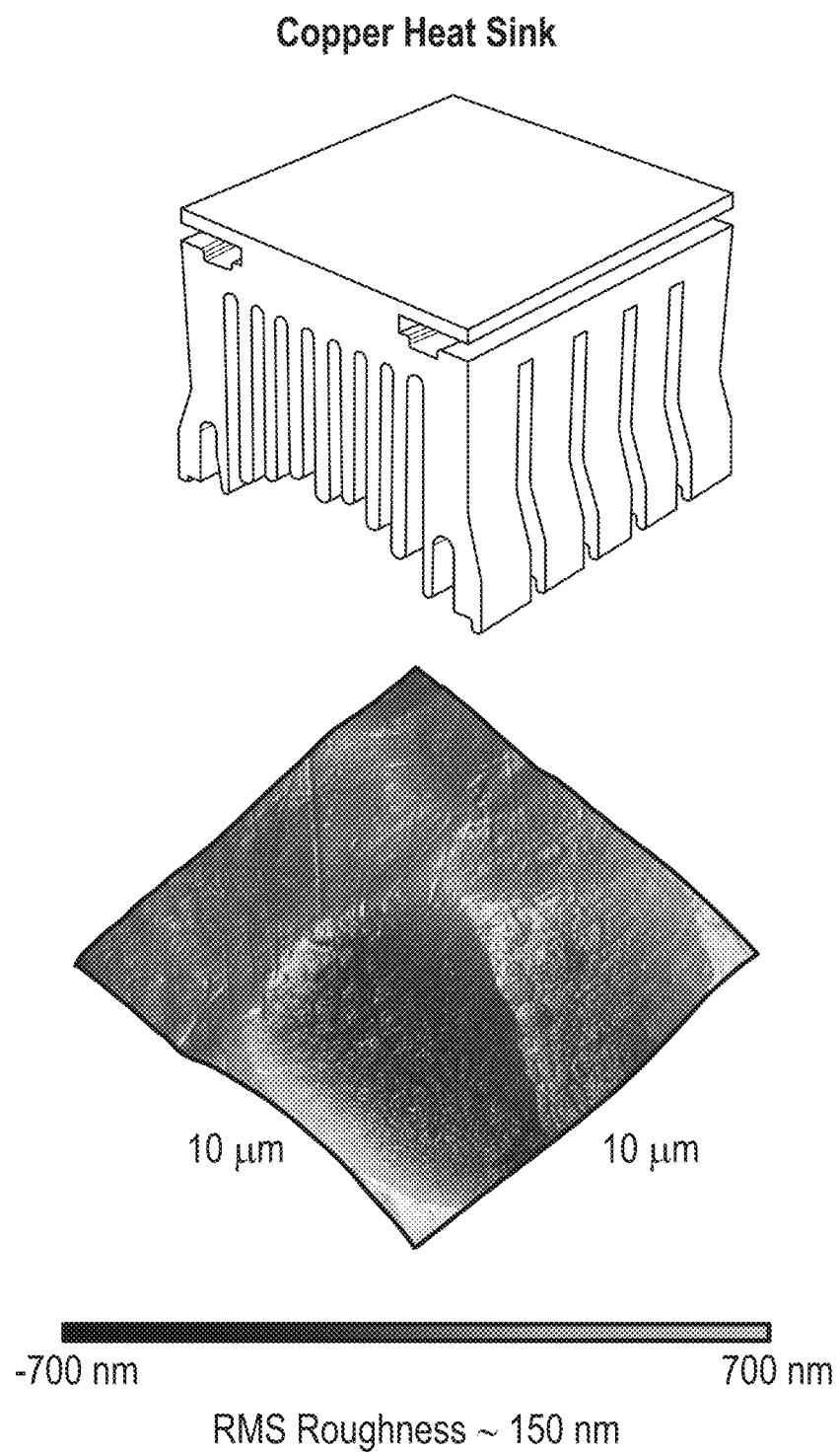
FIG. 5 depicts a copper heat sink and its surface roughness measured by AFM.

FIG. 5 depicts a copper heat sink.

Figure 6:
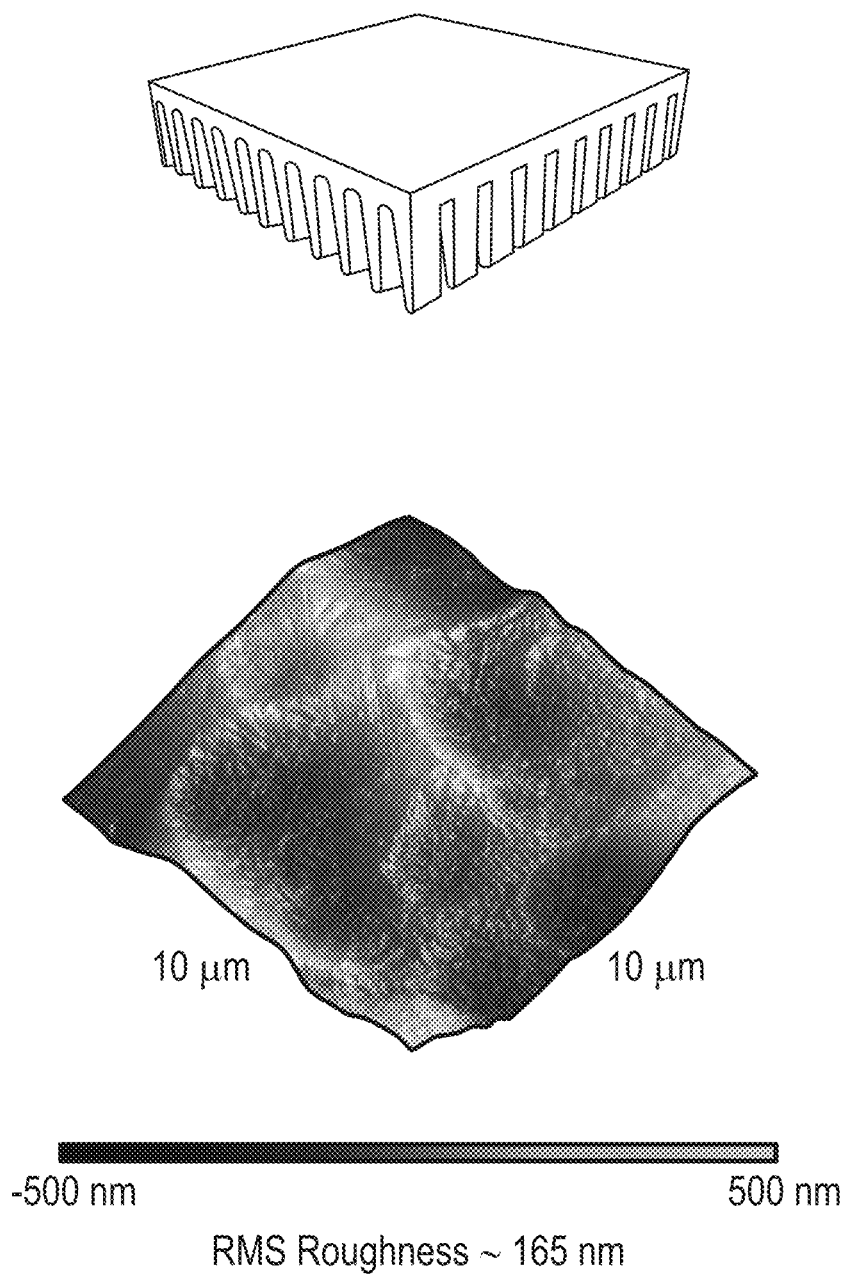
FIG. 6 depicts an aluminum heat sink and its surface roughness measured by AFM.

FIG. 6 depicts an aluminum heat sink.

Figure 7:
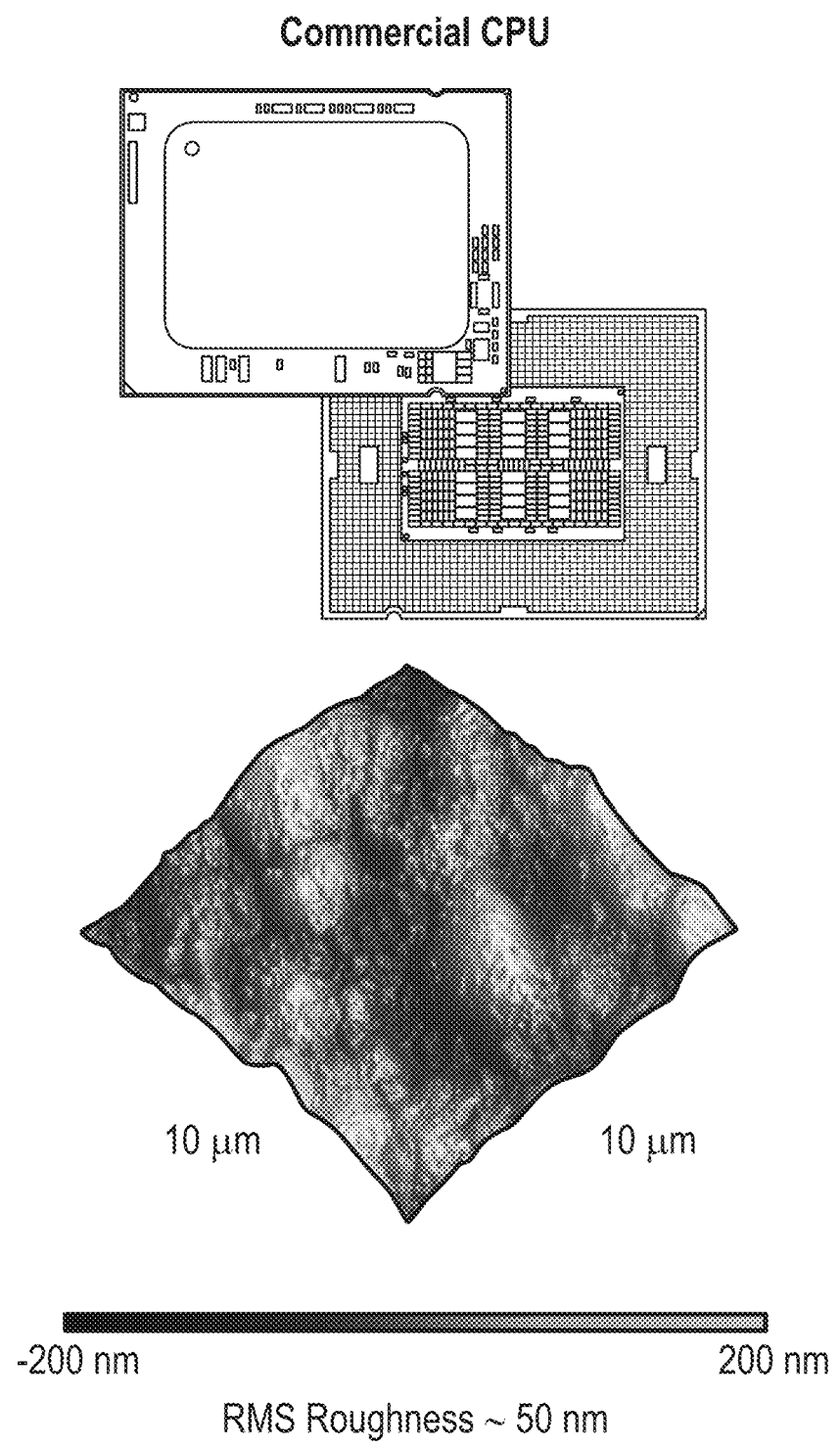
FIG. 7 depicts an Intel Xeon CPU and its surface roughness measured by AFM.

FIG. 7 depicts an Intel Xeon CPU and its surface roughness measured by AFM.

Figure 8:
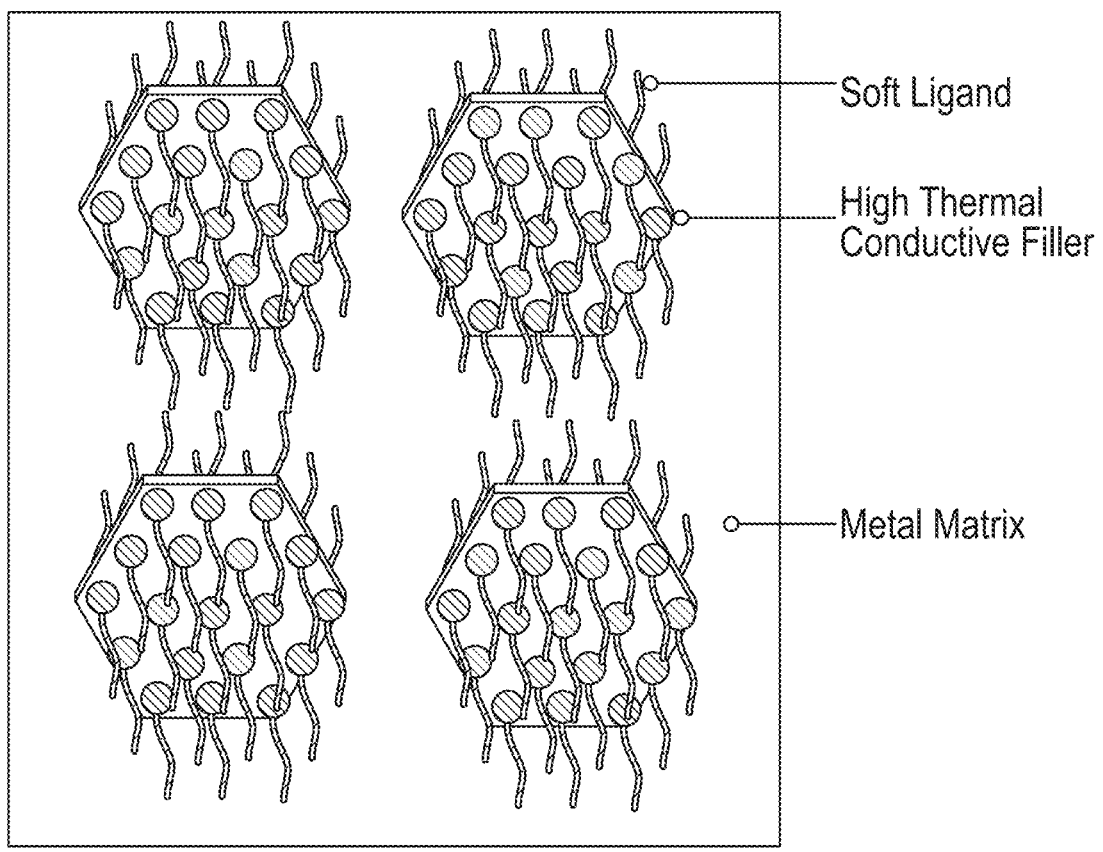
FIG. 8 depicts ligands decorating high thermal conductivity fillers to decrease the stiffness of nanocomposites.

FIG. 8 depicts ligands decorating high thermal conductivity fillers to decrease the stiffness of nanocomposites.

Figure 9C:
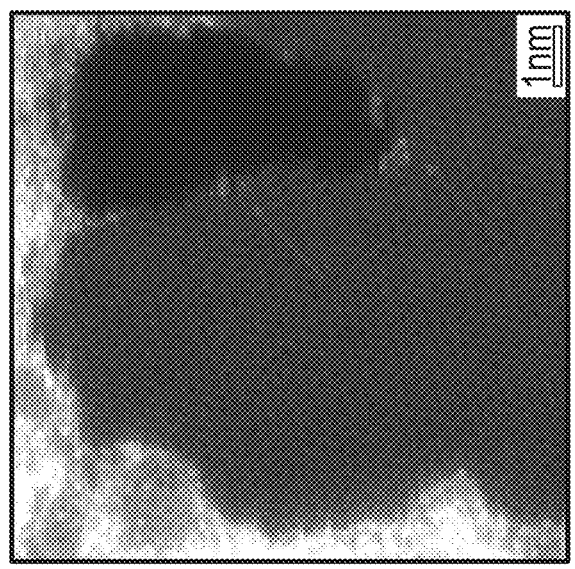
FIG. 9C depicts graphene etching in the presence of aluminum. (Adapted from Zan et al).
Figure 9B:
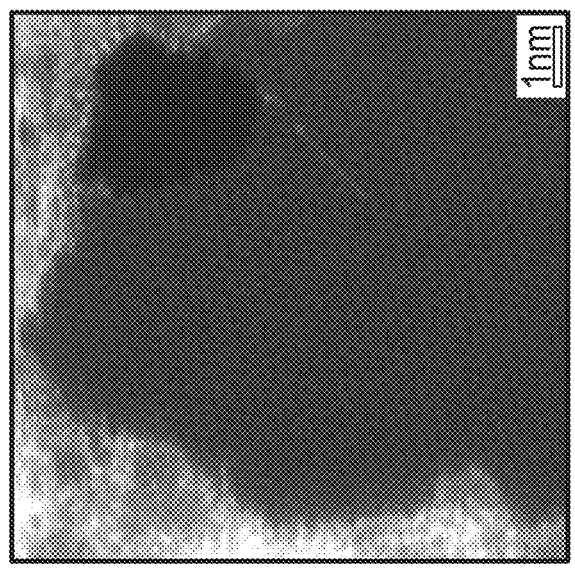
FIG. 9B depicts graphene etching in the presence of aluminum. (Adapted from Zan et al).
Figure 9A:
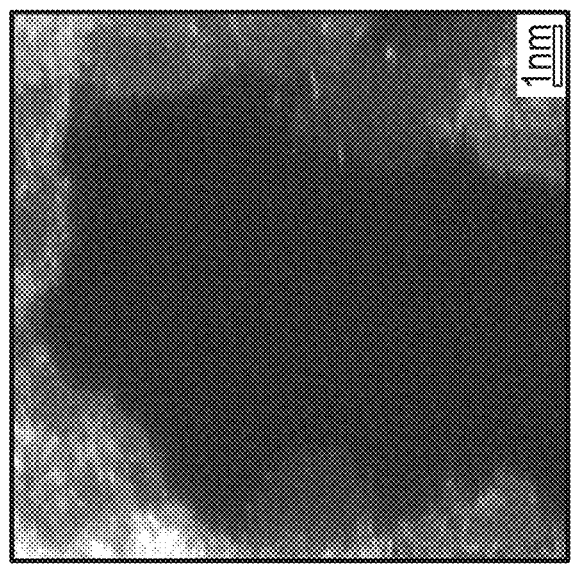
FIG. 9A depicts graphene etching in the presence of aluminum. (Adapted from Zan et al.).

FIG. 9A-9C depict graphene etching in the presence of aluminum. Similar results were observed in the presence of Ti, Pd, Cr, and Ni.

TABLE 1

Typical Average Roughness Values

| Process | rms roughness (μm) |
| --- | --- |
| Polishing | 0.1-0.4 |
| Grinding | 0.1-1.6 |
| Laser cutting | 0.8-6.3 |
| Die casting | 0.8-1.6 |
| Extrusion | 0.8-3.2 |
| Drilling | 1.6-6.3 |
| Sawing | 1.6-25 |

The military has a need for enhanced TIMs. In military applications, everything is driven by size, weight, and power considerations and as devices have become progressively smaller, more powerful, and more complex, they dissipate much larger amounts of heat.

The main objective is to develop TIMs with high thermal conductivity and low elastic and shear moduli.

TABLE 2

Design Rationale

| | Material | Thermal Conductivity (W/m · K) | Melting Point (° C.) | Young's modulus (GPa) |
| --- | --- | --- | --- | --- |
| Matrix | Epoxy | 0.1-0.3 | 80-100 | 2-5 |
| | Sn | 67 | 232 | 50 |
| | Pb | 35 | 327 | 16 |
| | Ag | 429 | 962 | 83 |
| | Cu | 401 | 1085 | 117 |

TABLE 3

Design Rationale

| | Material | Thermal Conductivity (W/m · K) | Melting Point (° C.) | Young's modulus (GPa) |
| --- | --- | --- | --- | --- |
| Filler | Graphene | 2000-4000 | Nd | nd |
| | Graphite | 50-250 | Nd | nd |
| | BN (Bulk) | 30-40 | Nd | nd |
| | BN Nanosheets | 1500-2000 | Nd | nd |
| | BN Nanoribbons | 1700-3000 | Nd | nd | nd = not determined

In an embodiment, an approach is to add high thermal conductivity filler into a soft but low thermal conductivity epoxy matrix. In another embodiment, an approach is to add high thermal conductivity filler into high thermal conductivity metal (or solder) matrix. Questions related to this approach include flexibility and rigidity. Yet another approach is to add soft ligands decorating high thermal conductivity fillers to decrease the stiffness of the nanocomposite.

Figure 10:
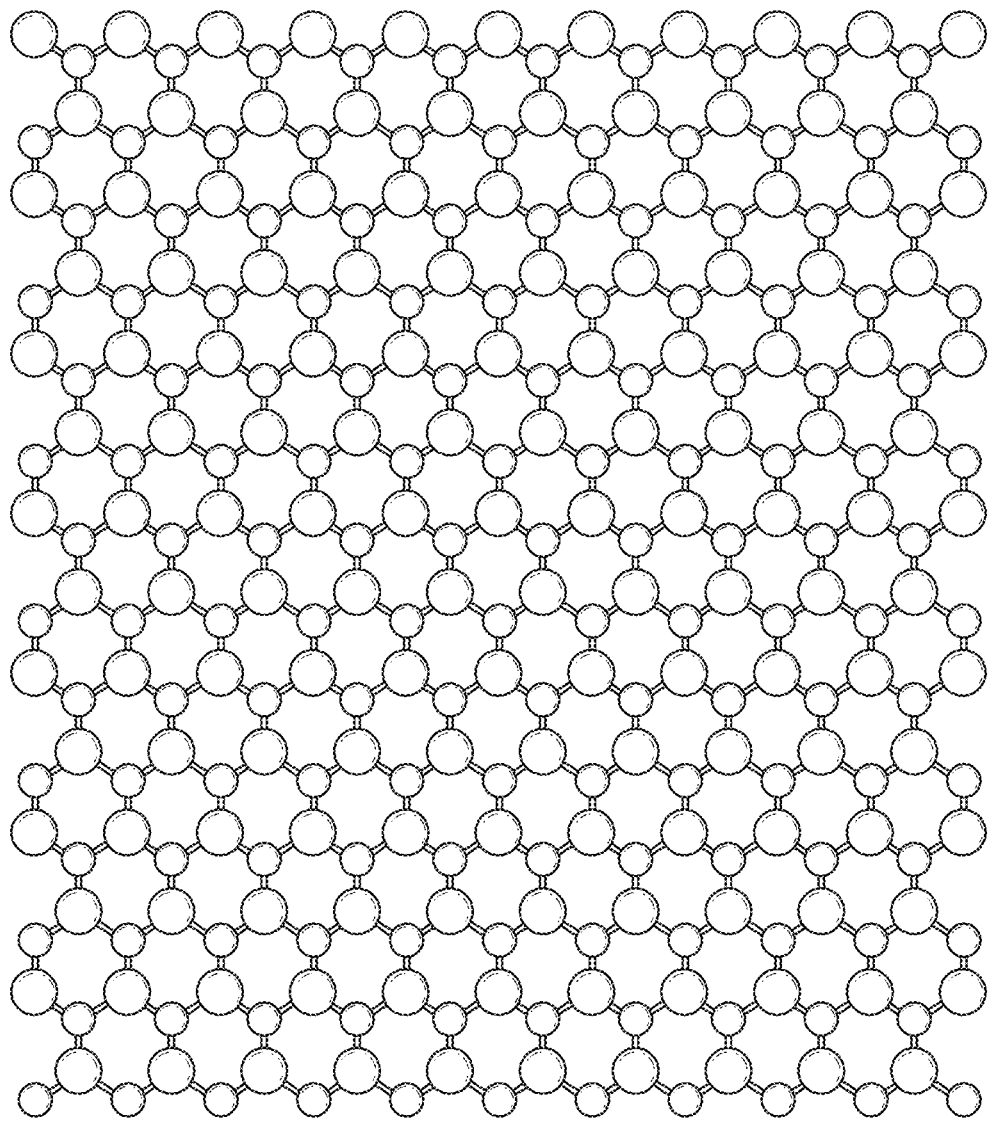
FIG. 10 depicts 2-D boron nitride nanomaterials. (Adapted from Greim et al.).

Graphene starts to show defects at ~500° C. BN is stable to decomposition at temperatures up to 1000° C. in air, 1400° C. in vacuum, and 2800° C. in an inert atmosphere. 2-D boron nitride nanomaterials are depicted in FIG. 10.

Figure 11:
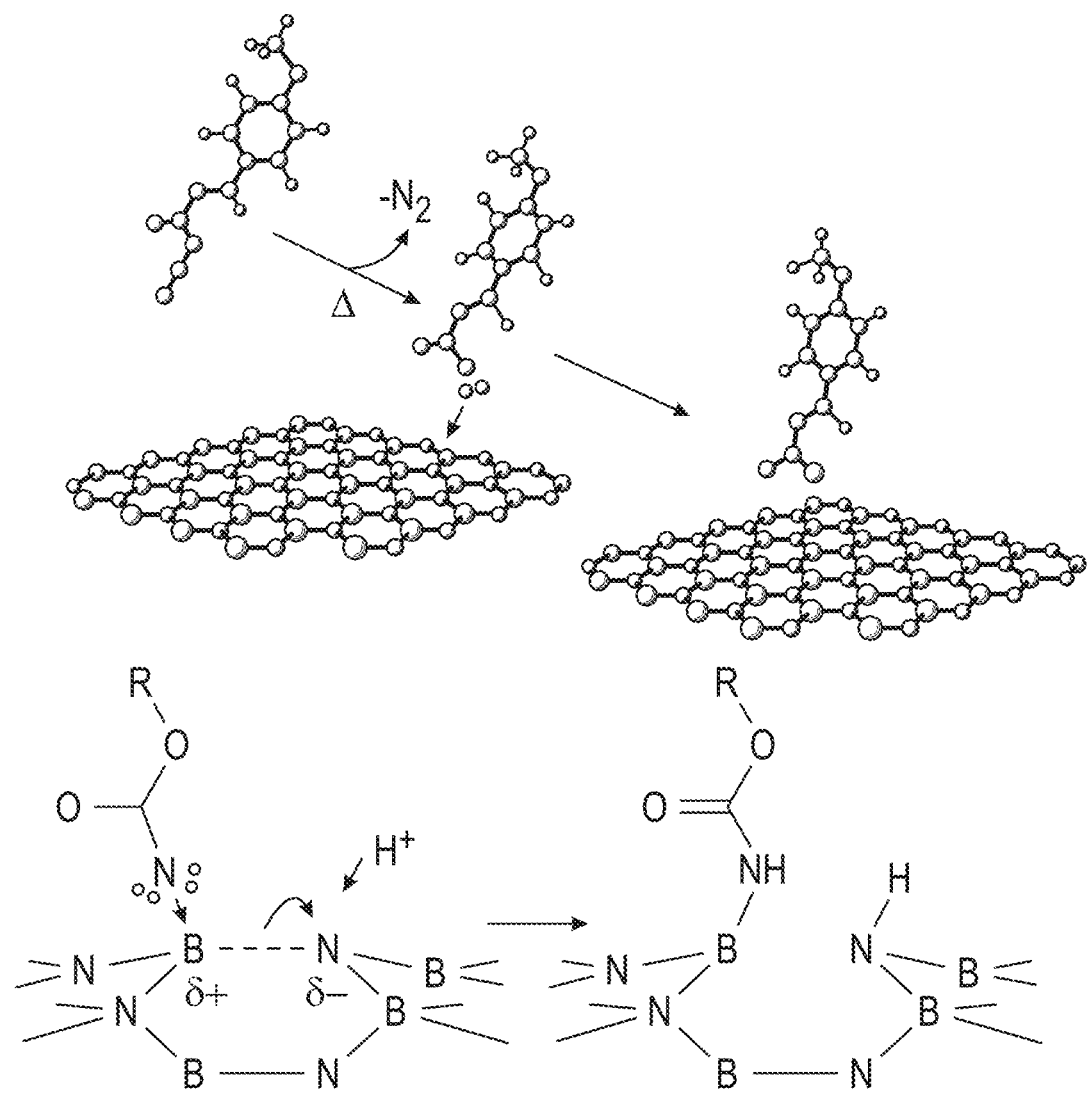
FIG. 11 depicts nitrine functionalization. (Adapted from Sainsbury et al.).
Figure 12:
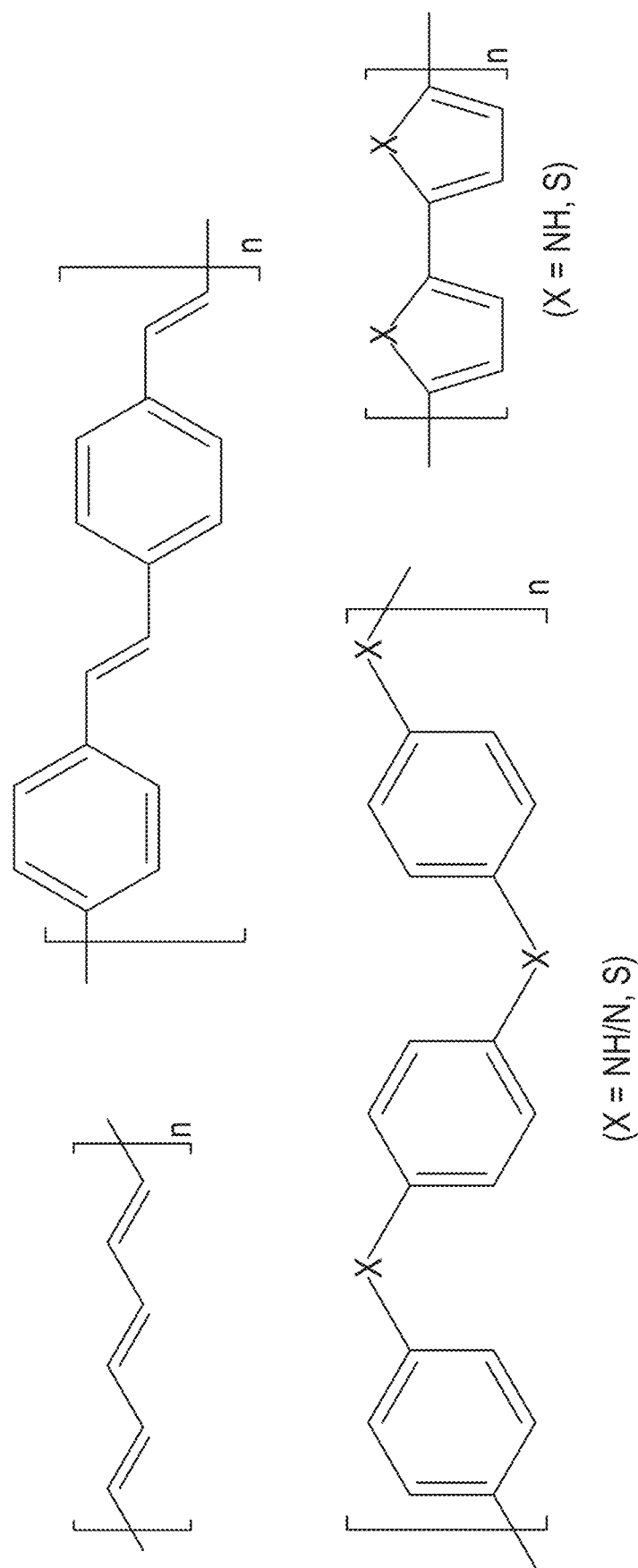
FIG. 12 depicts typical conductive polymers.
Figure 13A:
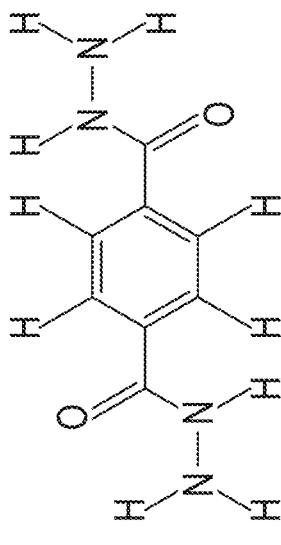
FIG. 13A depicts the structure of adipic acid dihydrazide.
Figure 13B:
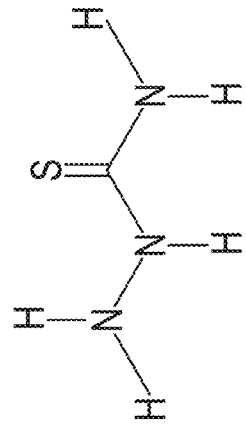
FIG. 13B depicts the structure of terepthalic dihydrazide.
Figure 13C:
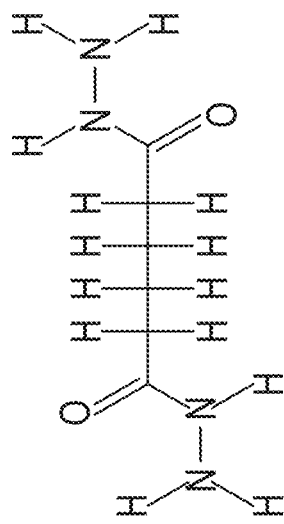
FIG. 13C depicts the structure of dodecanedioic dihydrazide.
Figure 13D:
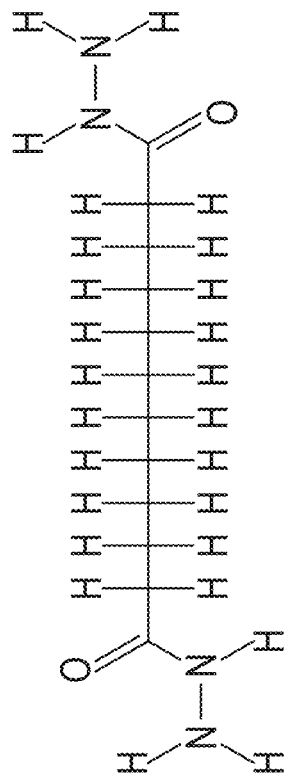
FIG. 13D depicts the structure of thiosemicarbazide.

Issues to consider when deciding which ligand to use are 1) reactivity against boron nitride (FIG. 11); 2) elastic modulus; and 3) thermal conductivity (FIG. 12 and FIG. 13A-13D). FIG. 11 depicts nitrine functionalization. Modulus values of ligands are typically less than 0.1 GPa. FIG. 12 depicts conductive polymers. Electrons which participate in electrical conduction take part in the transfer of heat. This includes but is not limited to 1) ligands with highly conjugated structures and 2) N or S atoms. FIG. 13A-13D depicts examples of ligands to be used.

Figure 14:
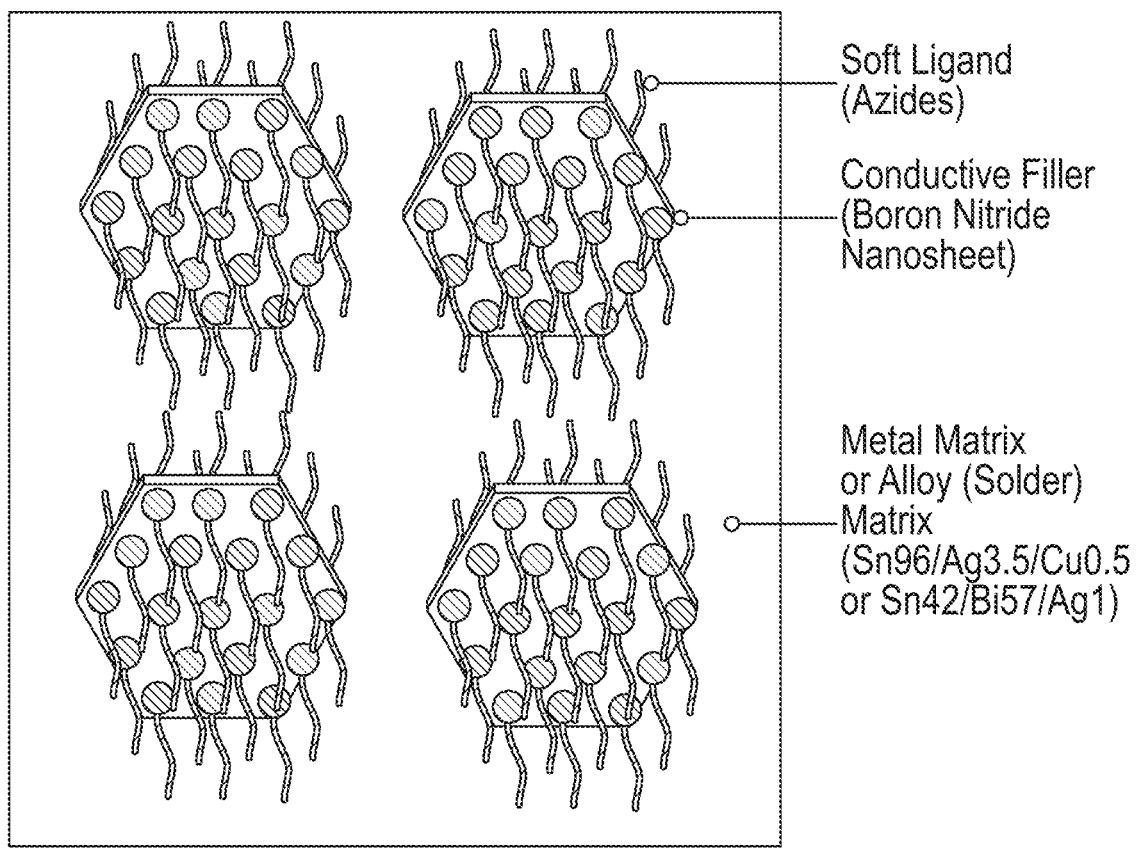
FIG. 14 depicts ligands decorating high thermal conductivity fillers to decrease the stiffness of nanocomposites.

FIG. 14 depicts an embodiment of the proposed system in which ligands decorate the high thermal conductivity fillers to decrease the stiffness of the nanocomposites.

Figure 15:
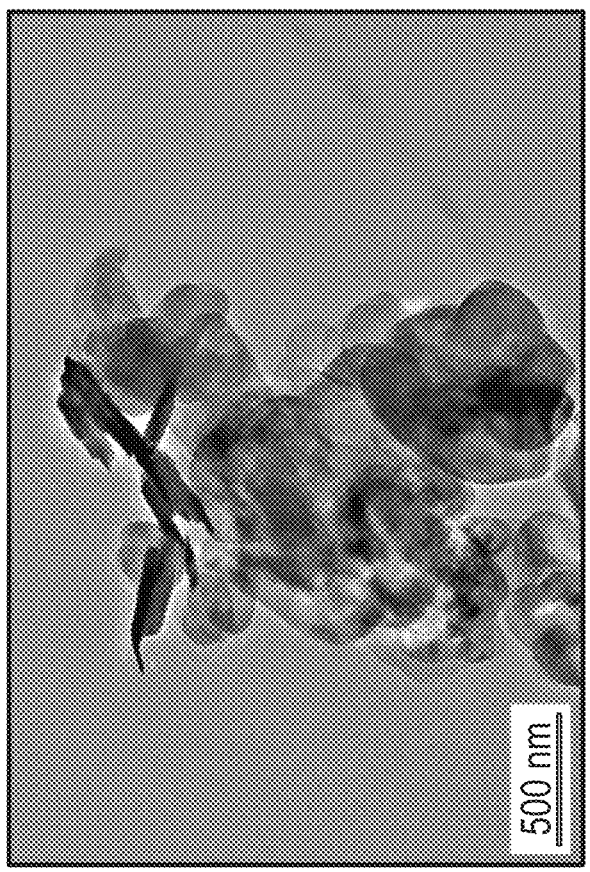
FIG. 15 depicts the exfoliation of boron nitride powder to form boron nitride nanosheets.
Figure 15:
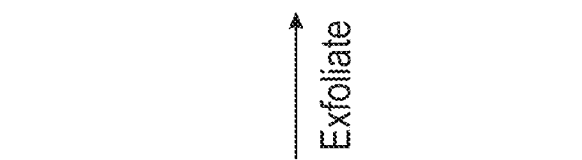

In an embodiment, the filler is prepared by exfoliating the boron nitride powder to form boron nitride nanosheets. FIG. 15.

Figure 16A:
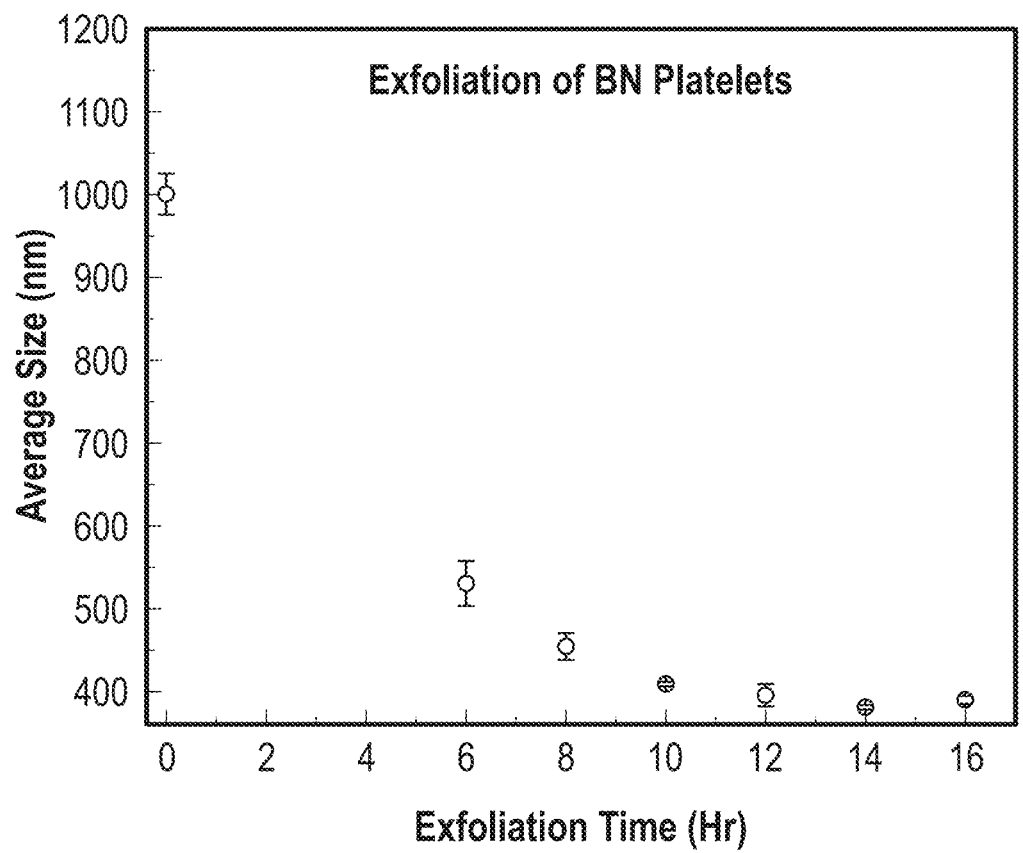
FIG. 16A depicts a graph of the average size of the BN platelets versus the exfoliation time.
Figure 16B:
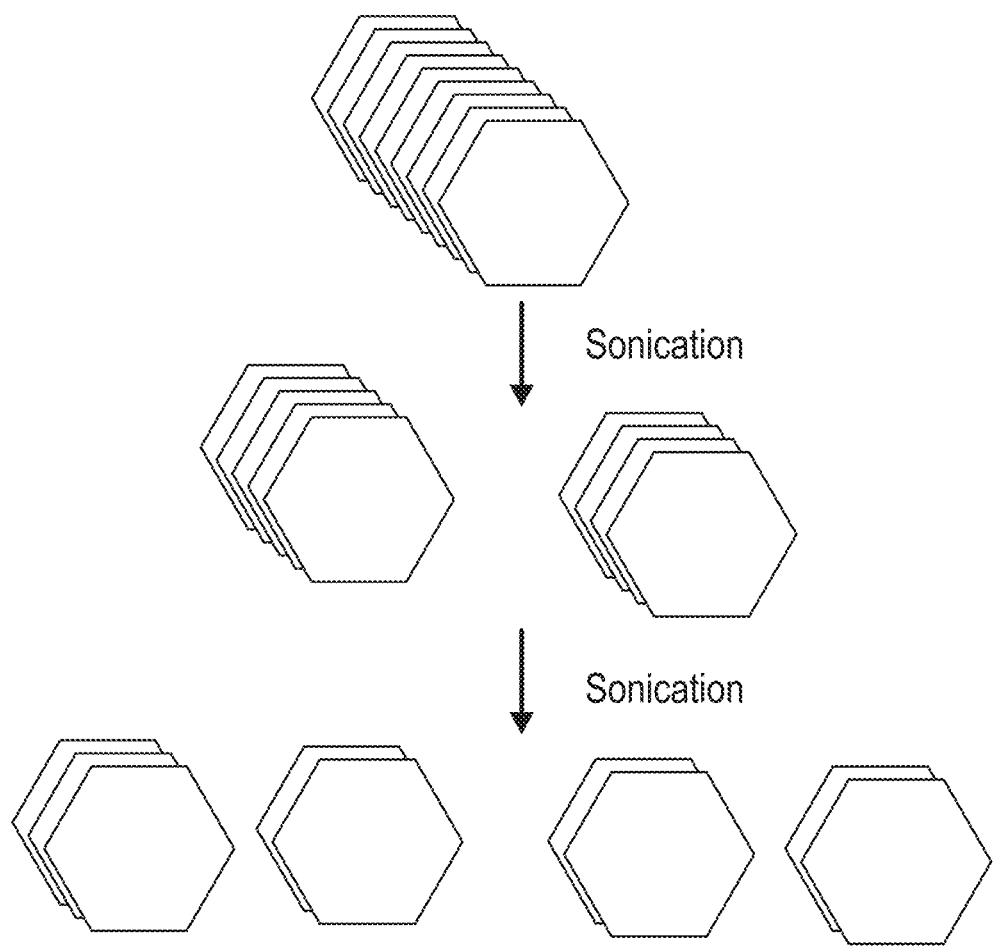
FIG. 16B depicts a diagram of the sonication of the BN platelets.

FIG. 16A depicts a graph of the average size of the BN platelets versus the exfoliation time. FIG. 16B depicts a diagram of the sonication of the BN platelets.

TABLE 4

BNNS fillers in a metal matrix

| Material | Surface Tension (mJ/m²) |
| --- | --- |
| Copper | 1360 |
| Lead | 442 |
| Mercury | 319 |
| Nickel | 1770 |
| Platinum | 2672 |
| Silver | 890 |
| Boron Nitride | ~55 |
| BNNS | 40 |
| Graphite | 105 |
| Graphene | 80 |

Figure 17:
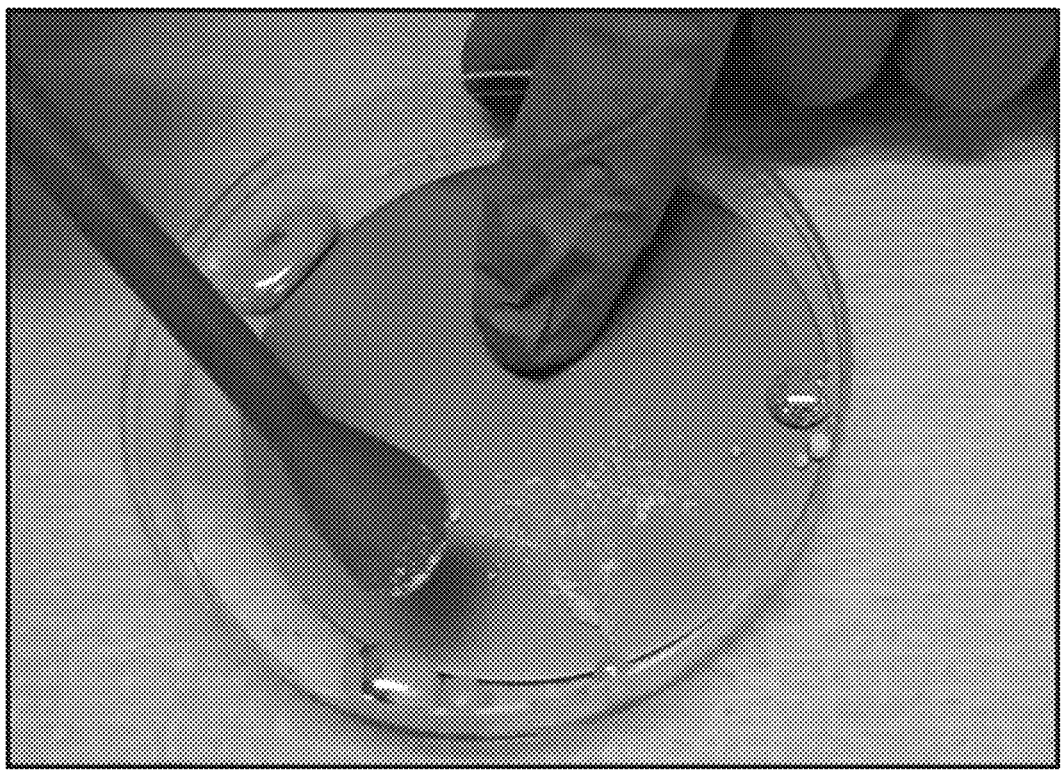
FIG. 17 depicts an interfacial energy mismatch.

FIG. 17 depicts an interfacial energy mismatch.

Figure 18A:
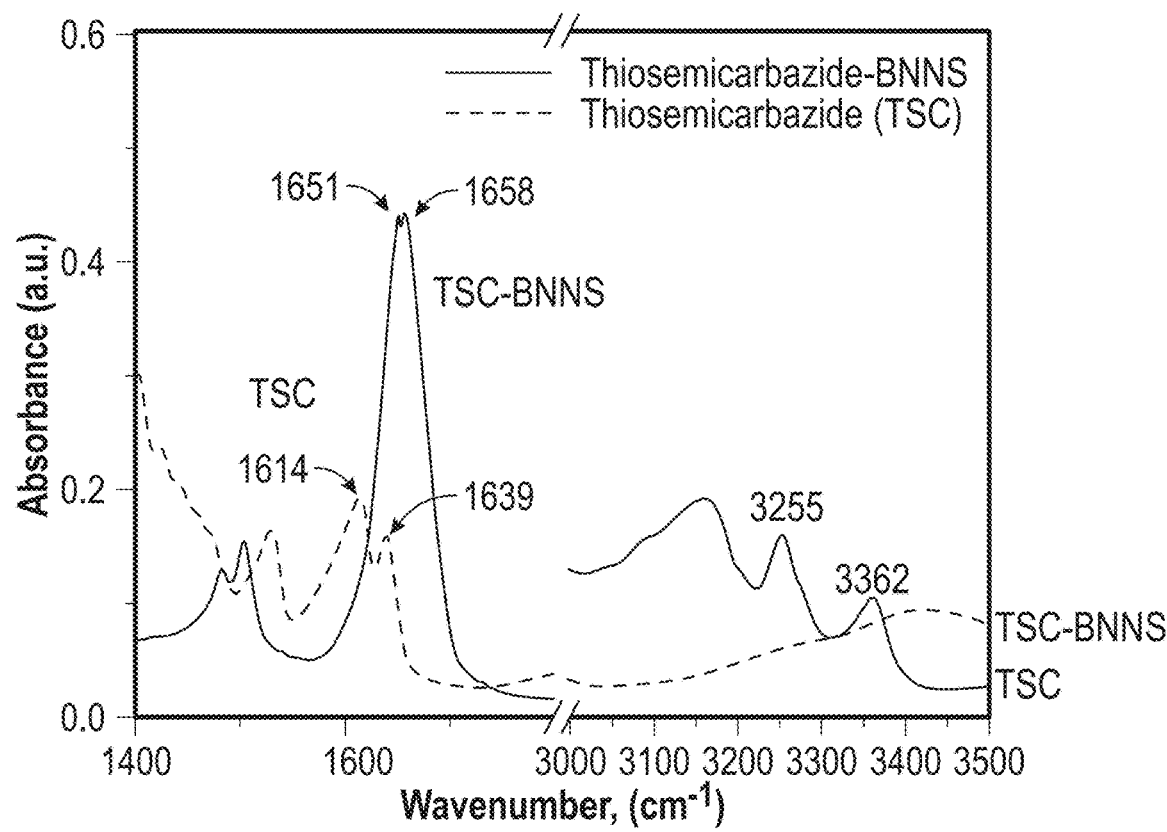
FIG. 18A depicts the functionalization of BNNS (f-BNNS).
Figure 18B:
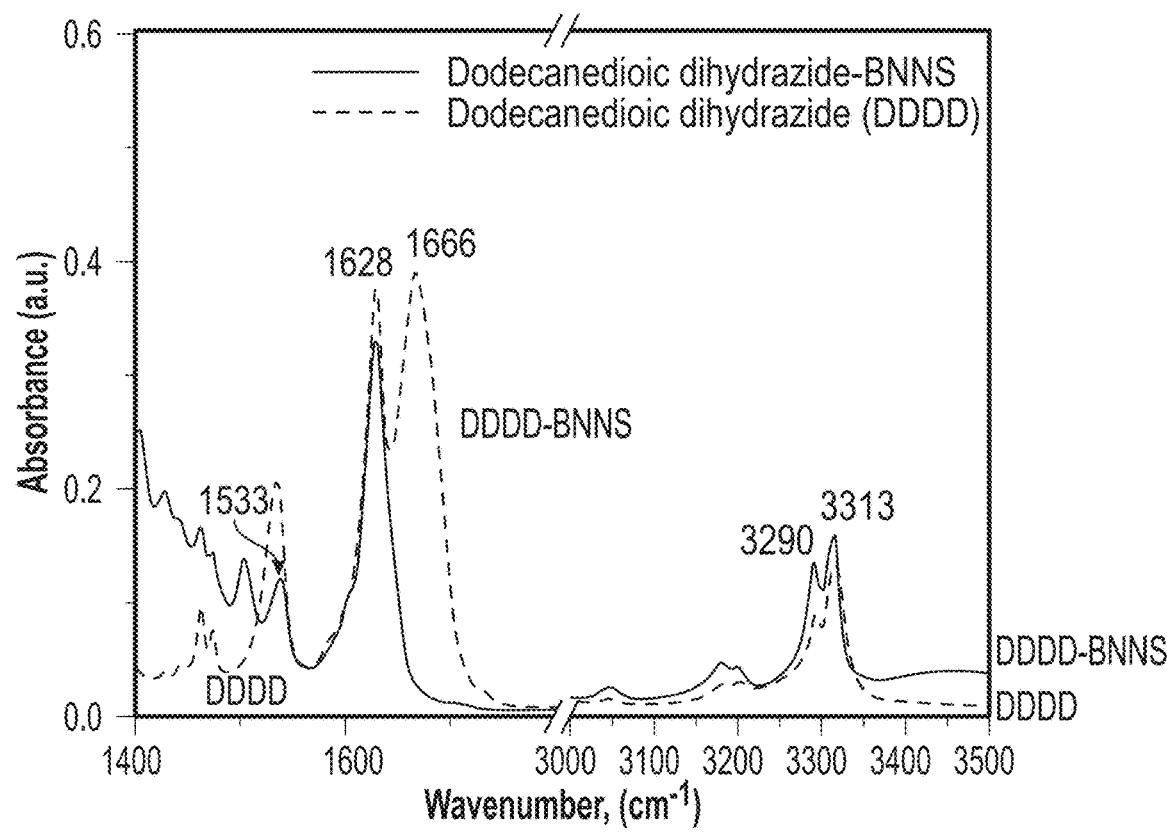
FIG. 18B depicts the functionalization of BNNS (f-BNNS).

FIG. 18A-18B depict the functionalization of BNNS (f-BNNS). Nitrine binds to BNNS and S/H groups can bind to the metal matrix. (a) FTIR Spectra of pure thiosemicarbazide and thiosemicarbazide functionalized BN nanosheets (FIG. 1) and (b) FTIR Spectra of pure dodecanedioic D and dodecanedioic D functionalized BN nanosheets.

Figure 19:
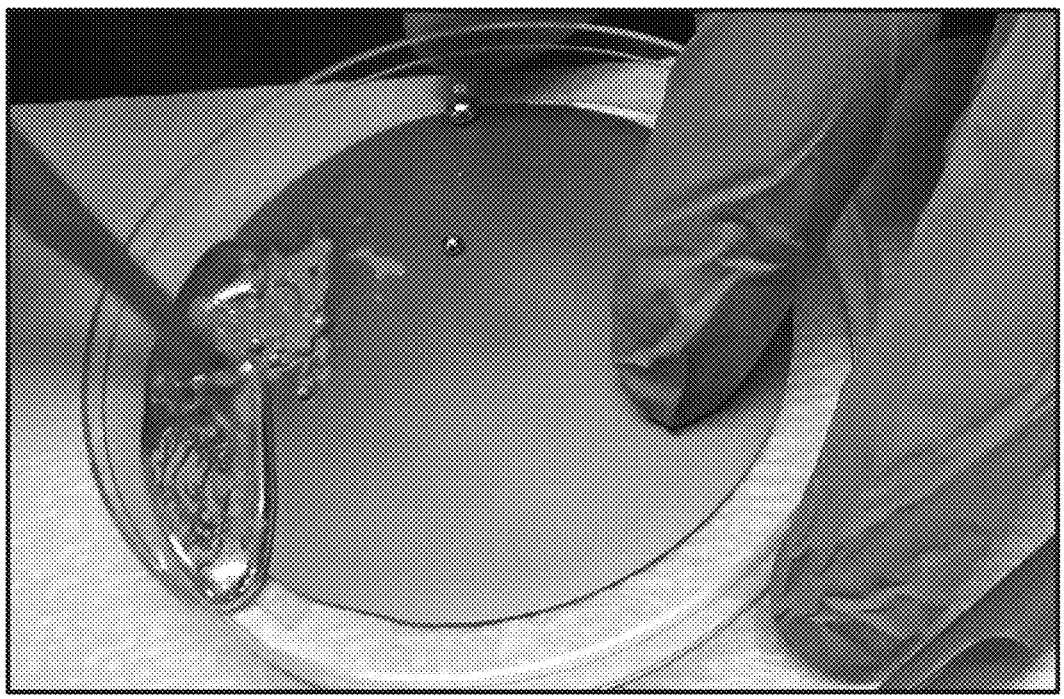
FIG. 19 depicts ligand-BNNS fillers in a metal matrix. In an embodiment, they are mixed with liquid metal (mercury).

FIG. 19 depicts ligand-BNNS fillers in a metal matrix. In an embodiment, they are mixed with molten Hg or In. The ligands decompose at about 200-400° C.

Figure 20A:
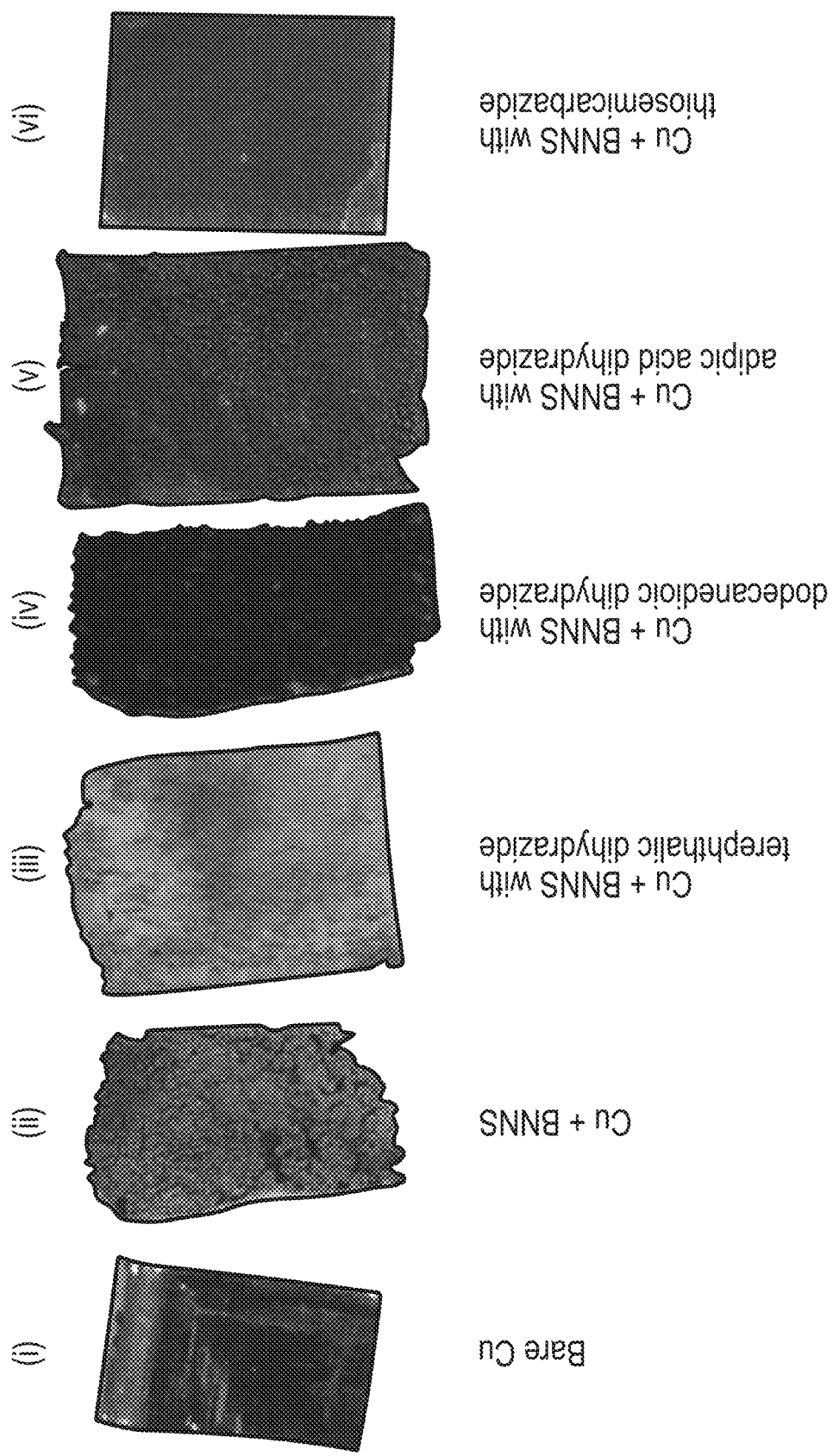
FIG. 20A depicts dispersing f-BNNS in Cu.
Figure 20C:
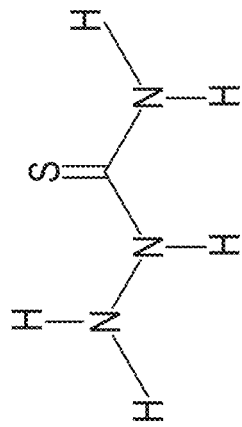
FIG. 20B-20E depict ligands used in f-BNNS.
Figure 20E:
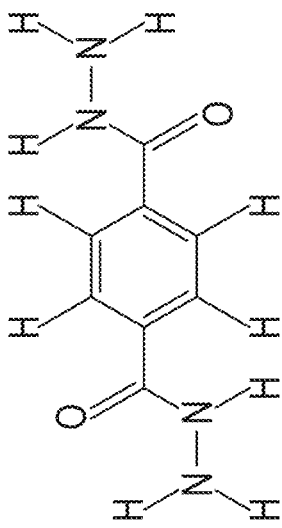
Figure 20B:
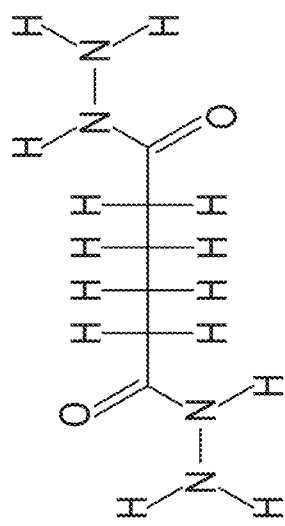
Figure 20D:
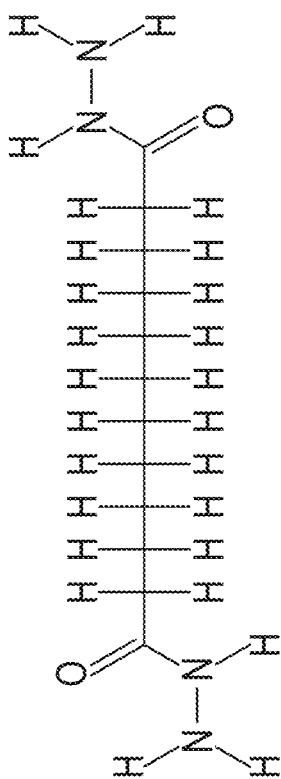

FIG. 20A depicts dispersing f-BNNS in Cu. In an embodiment, the metal can be Ag. FIG. 20B-20E depict ligands that can be used in f-BNNS.

Figure 21:
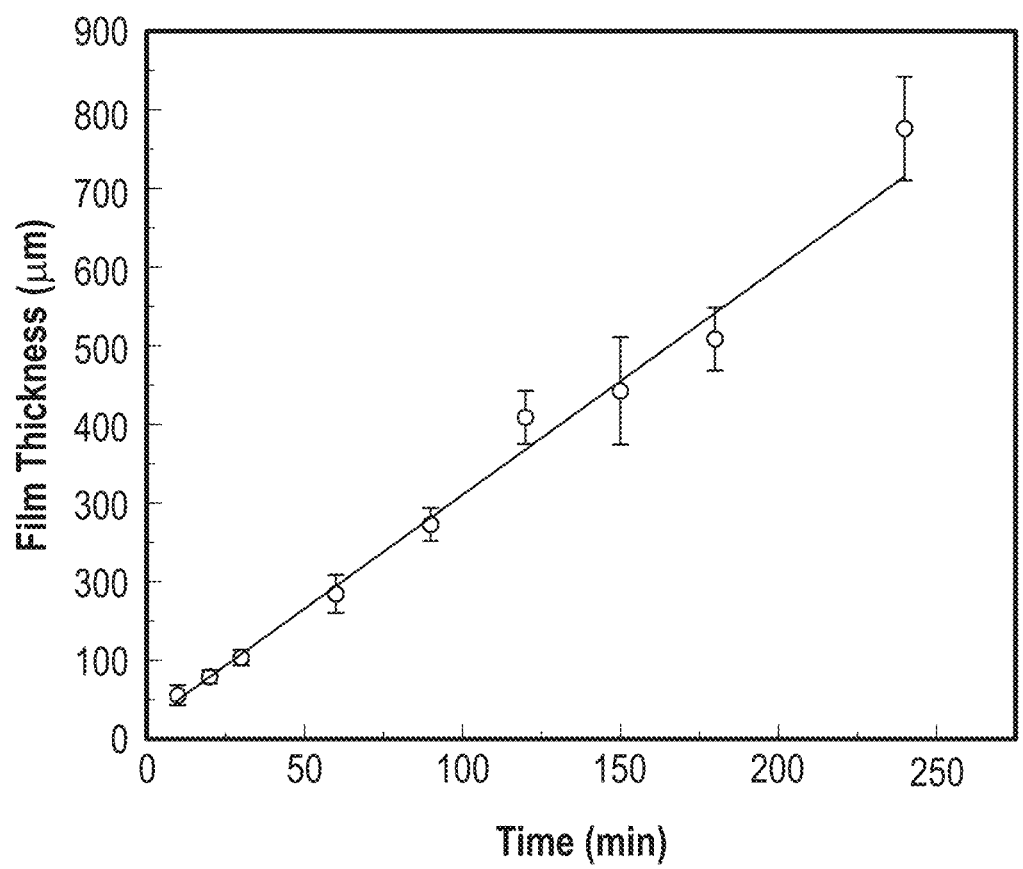
FIG. 21 depicts a graph of the effect of electroplating time.

FIG. 21 depicts a graph of the effect of electroplating time. As thickness increases, the electroplating time increases also.

Figure 22C:
FIG. 22A-22C depict a picture of the electrodeposited thin film and its SEM micrographs.
Figure 22B:
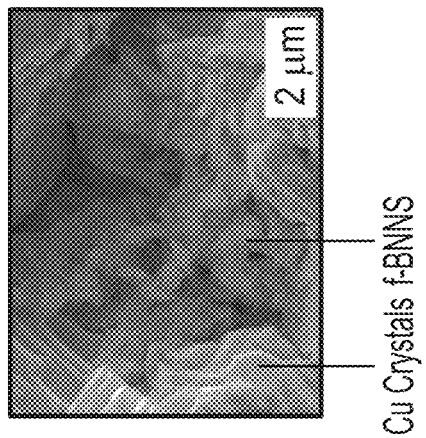
Figure 22A:
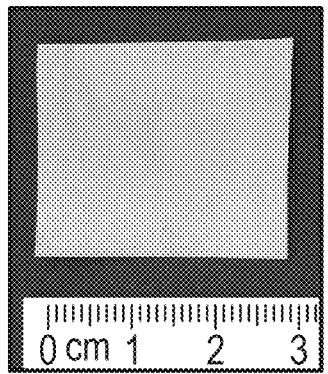

FIG. 22A-22C depicts a typical example of an electrodeposited Cu/FBNNS nanocomposite and SEM micrographs obtained from this nanocomposite (a) image of the sample at 20 vol % f-BNNS loading; (b) low magnification SEM micrograph; and (c) high magnification SEM micrograph.

Figure 23:
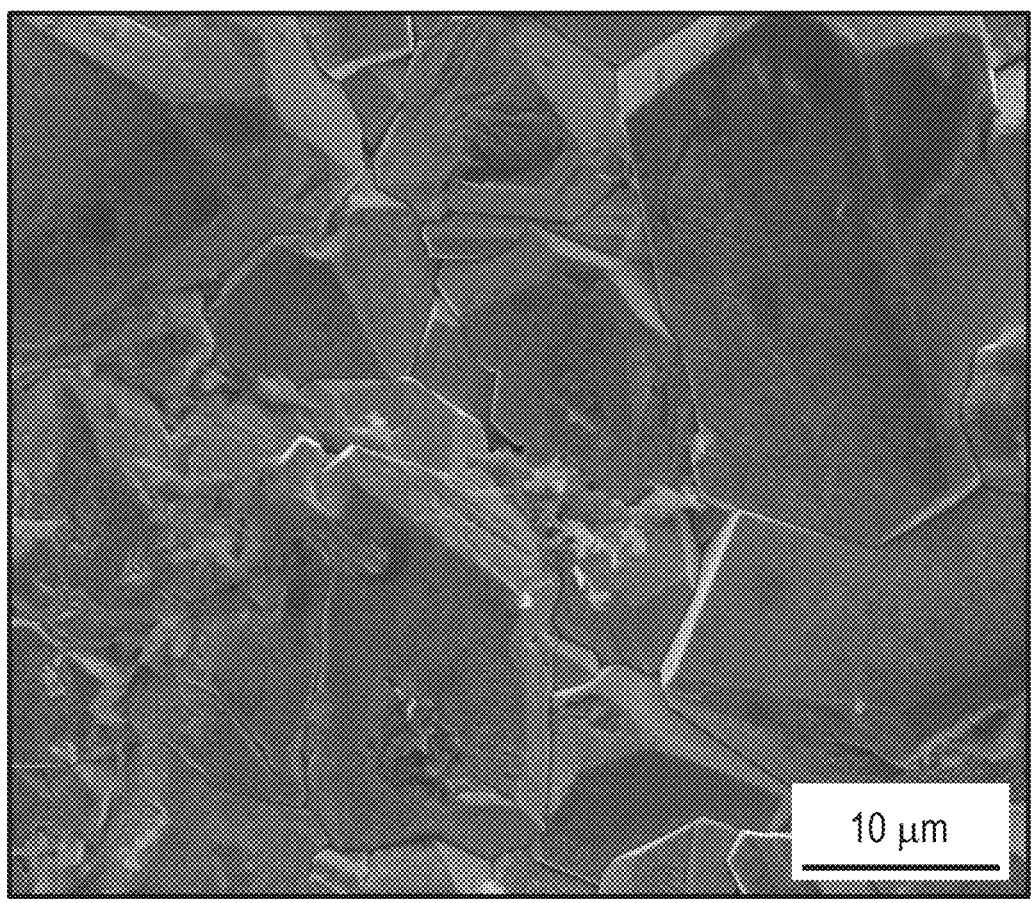
FIG. 23 depicts a region of interest where EDS analysis was performed

FIG. 23 depicts a region of interest where EDS analysis was performed.

Figure 24:
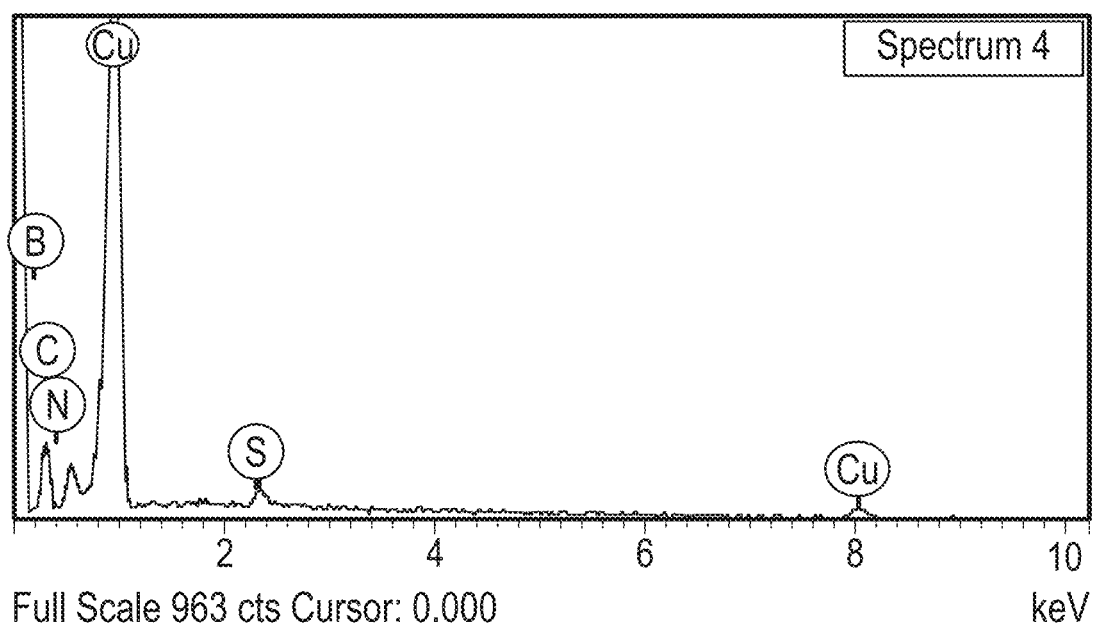
FIG. 24 depicts an EDS spectrum obtained during elemental analysis of Cu—BNNS Nanocomposite.

FIG. 24 depicts a typical EDS spectrum obtained during elemental analysis of a Cu—BNNS Nanocomposite.

Density is calculated using Archimedes principle. "Any object, wholly or partially immersed in a fluid, is buoyed up by a force equal to the weight of the fluid displaced by the object". This means volume of fluid displaced by an immersed body is equal to the volume of the body. Hollow cylinder with volume markings of 0.01 ml is taken and observed under a zoom-in camera. A pre-determined weight of material is cut into pieces and put into the cylinder and the raise in the cylinder is observed from the camera. Now we know the volume and weight of the material which in turn facilitates the density calculation.

TABLE 5

| f-BNNS Input (wt %) | Average BN Concentration in Nanocomposite (vol %) | Density of Nanocomposite (g/cm³) |
|---|---|---|
| 0 | 0.0 | 9.06 |
| 0.1 | 1.9 | 8.13 |
| 0.25 | 4.7 | 8.27 |
| 0.5 | 9.1 | 5.76 |
| 0.75 | 13.2 | 6.86 |
| 1 | 17.0 | 7.35 |
| 1.5 | 20.5 | 10.64 |
| 2 | 23.9 | 6.35 |
| 2.5 | 30.0 | 6.81 |

Figure 25:
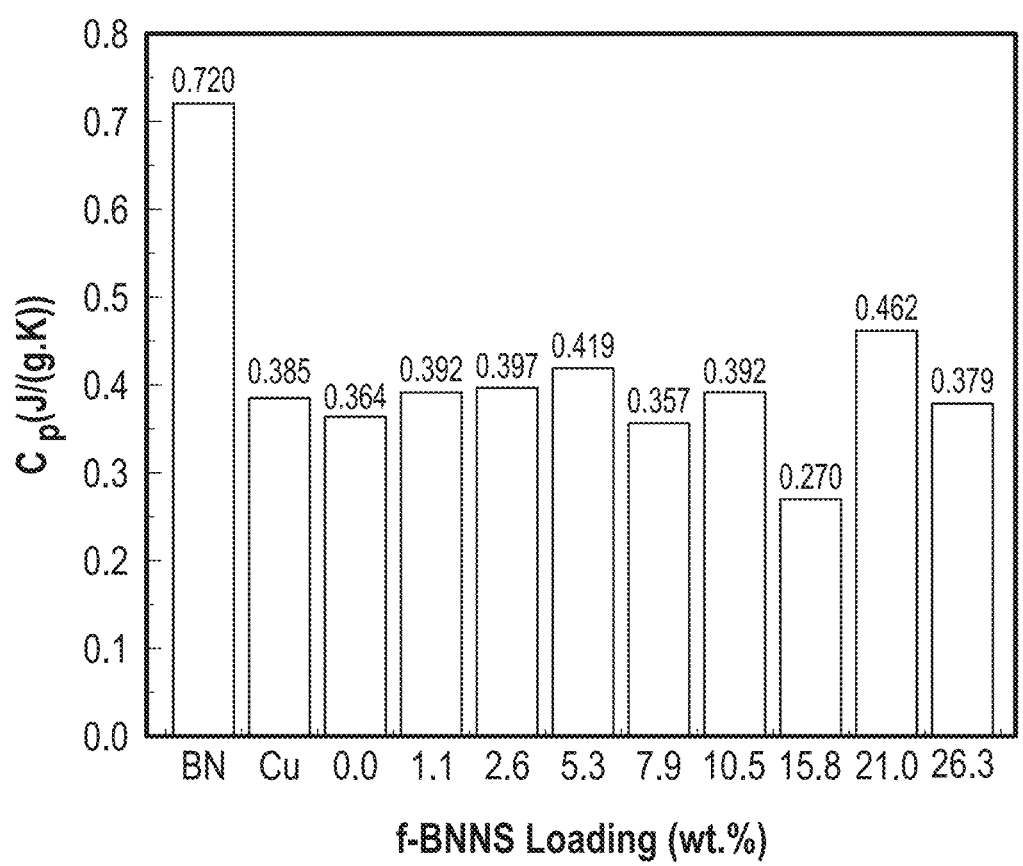
FIG. 25 depicts the effect of f-BNNS concentration on specific heat.

$\rho_{Cu}=8.96$ g·cm$^{-3}$ $\rho_{BN}=2.10$ g·cm$^{-3}$ $\rho_{Ligand}=0.78$ g·cm$^{-3}$ $\rho_c = \rho_f V_f + \rho_m V_m$ FIG. 25 depicts the effect of f-BNNS concentration on specific heat. The Cp of Cu and BN is 0.385 and 0.720 J/g·K, respectively.

FIG. 26A depicts an equation to determine thermal diffusivity.

Figure 26B:
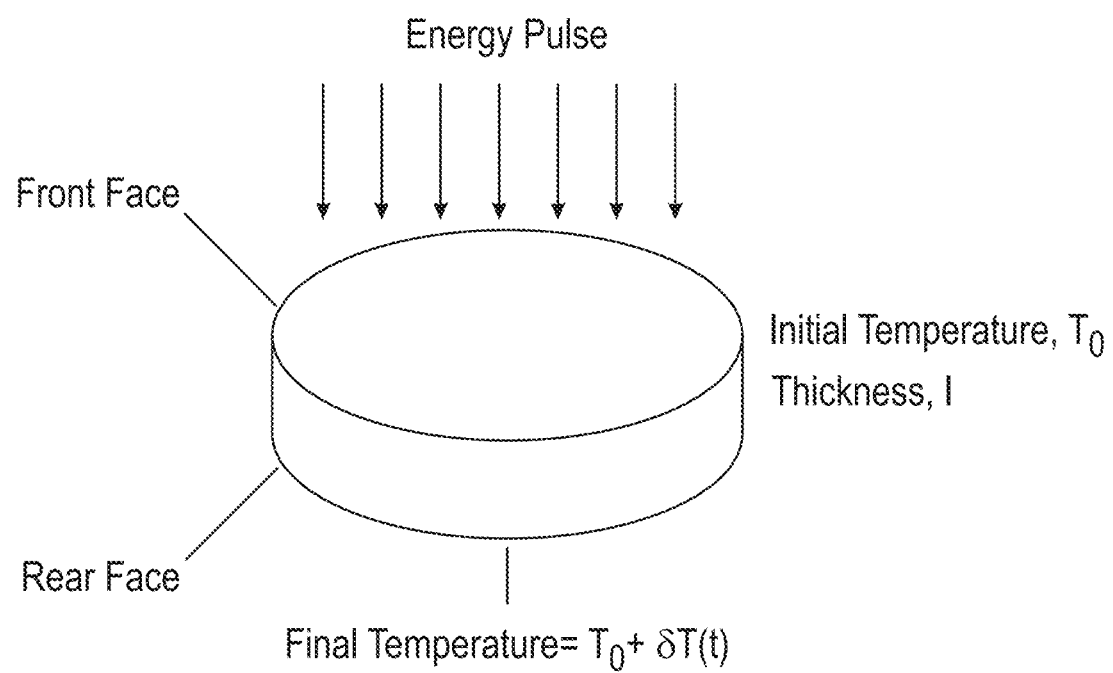
FIG. 26B depicts a diagram of a nanosheet indicating a front face, rear face, thickness, energy pulse, initial temperature, and final temperature.

FIG. 26B depicts a diagram of a nanosheet indicating a front face, rear face, thickness, energy pulse, initial temperature, and final temperature.

Figure 26C:
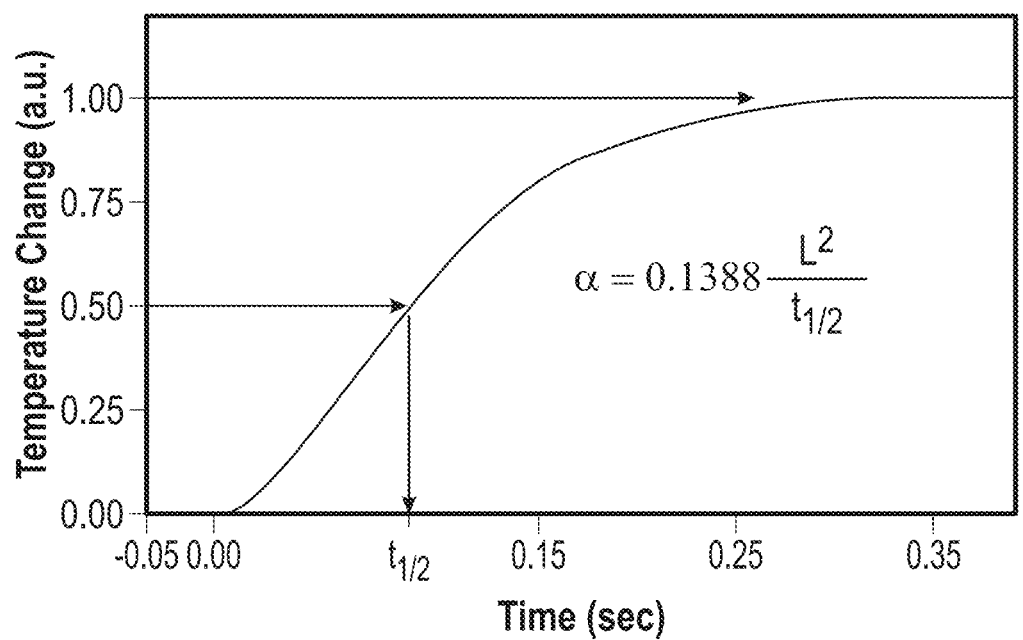
FIG. 26C depicts a graph of the temperature change versus time in seconds.

FIG. 26C depicts a graph of the temperature change versus time in seconds. The t½ is the time at which 50% of the total temperature change has occurred.

TABLE 6

| f-BNNS Output loading (vol %) | Thermal Diffusivity (cm²/s) | | | |
|---|---|---|---|---|
| | T = 25° C. | T = 50° C. | T = 75° C. | T = 100° C. |
| 0.0 | 1.12 | 1.14 | 1.13 | 1.13 |
| 1.9 | 1.07 | 1.08 | 1.08 | 1.06 |
| 4.7 | 0.91 | 0.90 | 0.89 | 0.89 |
| 9.1 | 1.01 | 1.01 | 0.99 | 0.98 |
| 13.2 | 1.06 | 1.06 | 1.05 | 1.06 |
| 17.0 | 0.98 | 0.97 | 0.97 | 0.95 |
| 20.5 | 1.03 | 1.04 | 1.03 | 1.02 |
| 23.9 | 0.94 | 0.99 | 0.94 | 0.91 |
| 30.0 | 1.08 | 1.08 | 1.09 | 1.09 |

TABLE 7

| f-BNNS Output loading (vol %) | Thermal Conductivity (cm²/s) | | | |
|---|---|---|---|---|
| | T = 25° C. | T = 50° C. | T = 75° C. | T = 100° C. |
| 0.0 | 370.51 | 372.17 | 373.10 | 369.98 |
| 1.9 | 340.32 | 364.12 | 373.12 | 376.23 |
| 4.7 | 298.39 | 300.22 | 297.89 | 296.76 |
| 9.1 | 243.26 | 227.85 | 228.61 | 234.58 |
| 13.2 | 258.85 | 267.91 | 270.37 | 283.91 |
| 17.0 | 282.11 | 279.21 | 285.27 | 283.49 |
| 20.5 | 295.94 | 297.15 | 298.46 | 280.64 |
| 23.9 | 275.09 | 282.85 | 274.47 | 271.33 |
| 30.0 | 279.71 | 281.36 | 285.15 | 293.77 |

Figure 27A:
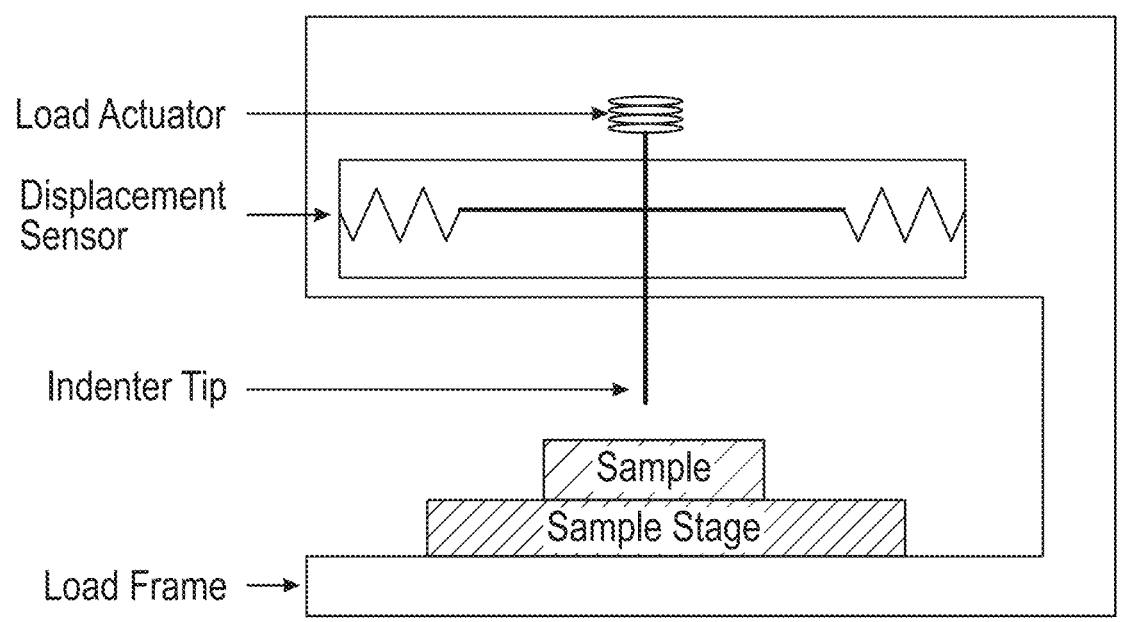
FIG. 27A depicts a diagram of an instrument for measuring nanoindentation.

FIG. 27A depicts a diagram of an instrument for measuring nanoindentation.

Figure 27B:
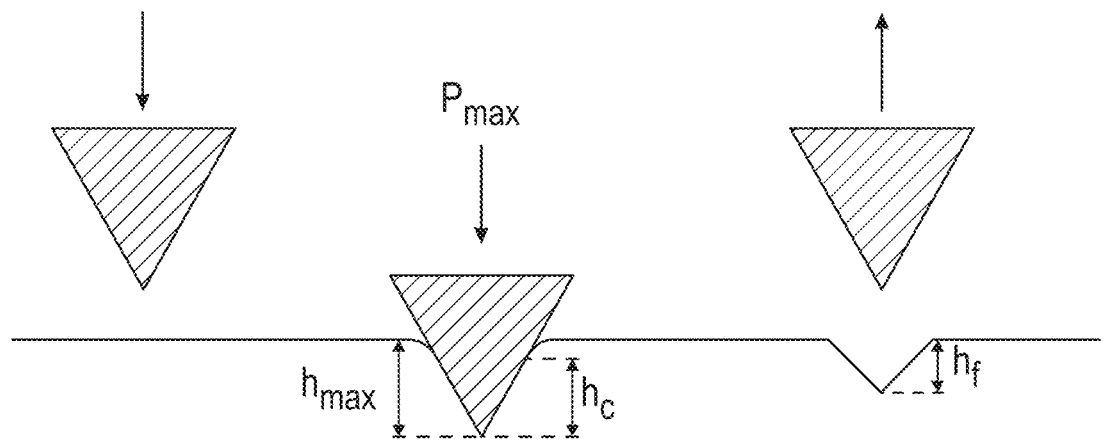
FIG. 27B depicts a diagram of measurement of nanoindentations.

FIG. 27B depicts a diagram of nanoindentation measurement.

Figure 27C:
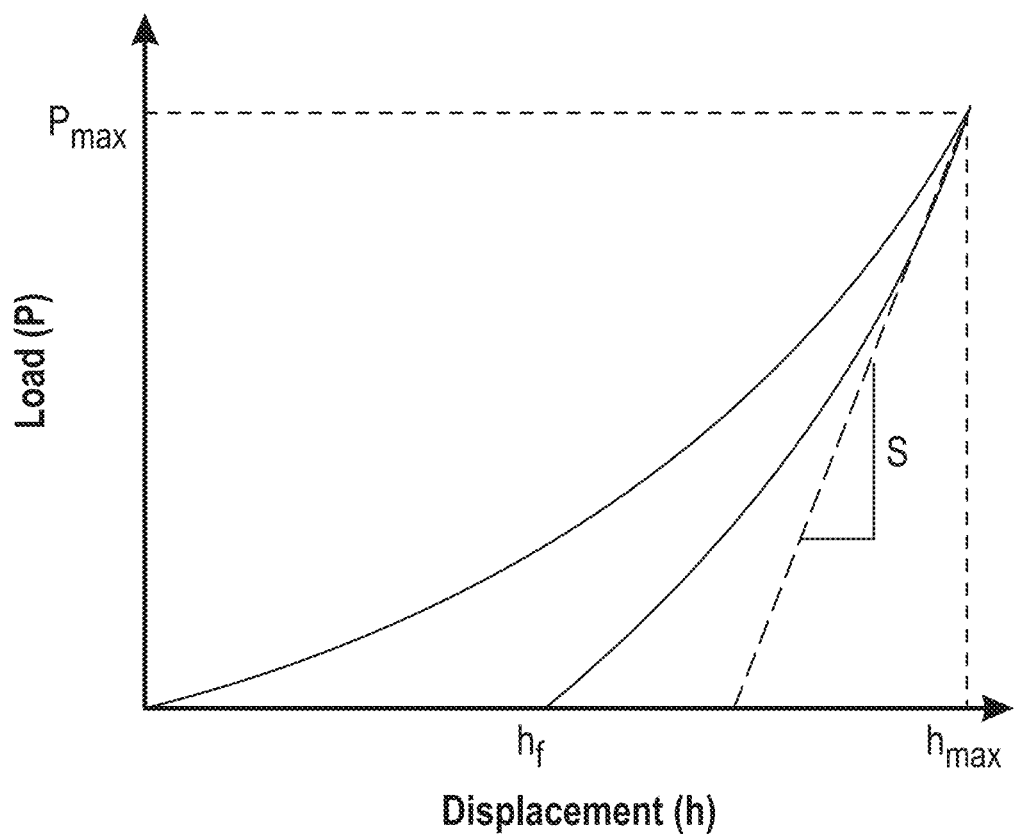
FIG. 27C depicts a graph of a load displacement curve.

FIG. 27C depicts a graph of a load displacement curve.

Figure 27D:
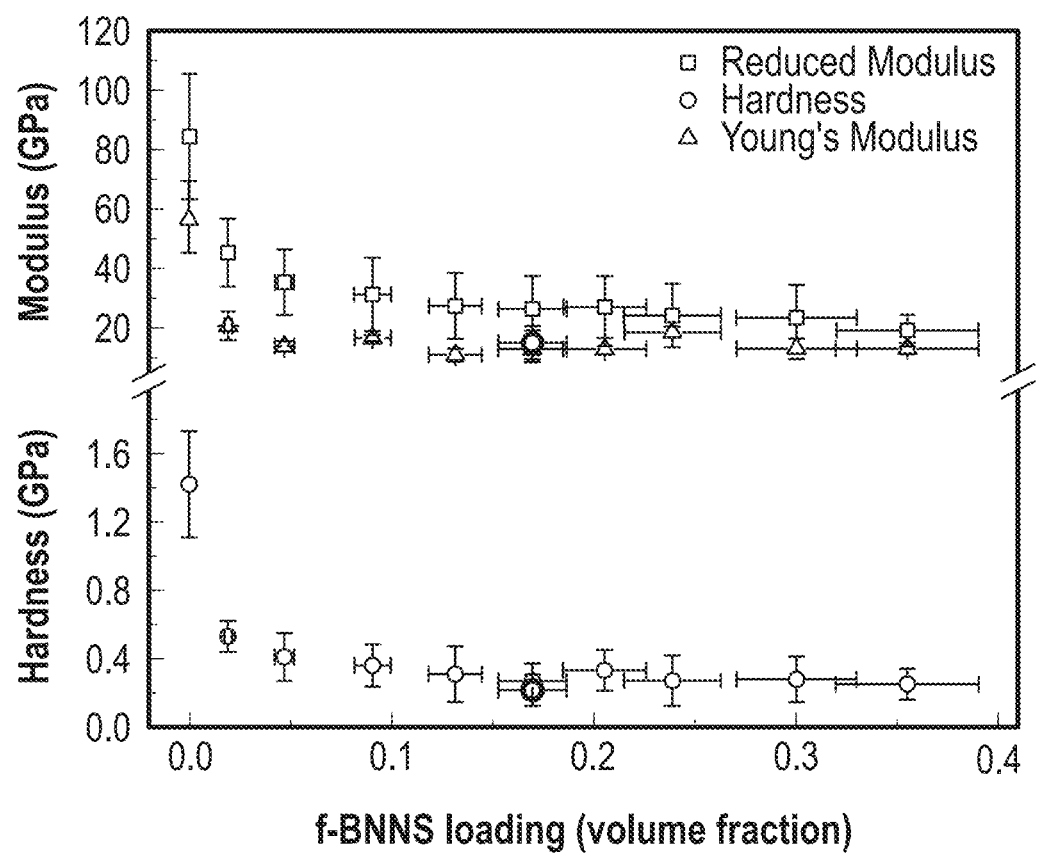
FIG. 27D depicts a graph of reduced modulus versus BN concentration. H is the hardness and $E_r$ is the reduced Young's modulus and Y is Young's Modulus.

FIG. 27D depicts a graph of reduced modulus versus BN concentration. H is the hardness and $E_r$ is the reduced Young's modulus and Y is the Young's Modulus.

FIG. 27E depicts an equation showing the relationship of the reduced modulus $E_r$ to Young's modulus $E_s$ of the test specimen. The subscript i is a property of the indenter tip material and υ is Poisson's ratio ($υ_i$ for the indenter tip and $υ_s$ for the specimen).

TABLE 8

| | Pure Matrix | | | Nanocomposite | | |
|---|---|---|---|---|---|---|
| Description | Filler Conc. (wt %) | $E_r$ (GPa) | H (GPa) | Filler Conc. (wt %) | $E_r$ | H (GPa) |
| f-BNNS-Copper Nanocomposites | 0 | 99-125 | 1.1-2.8 | 26.3 | 15.32 | 0.21 |
| SWCNT-Reinforced in Epoxy | 0 | 2-5 | 0.25 | 11 | 4-10 | 0.275 |

Figure 28C:
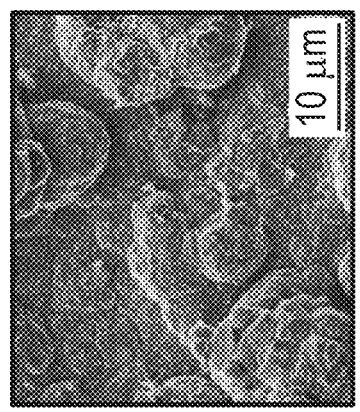
FIG. 28A-28C depicts a picture of a) a nanocomposite sample containing PEG-dithiol; b) and c) SEM Micrographs obtained from this sample.
Figure 28B:
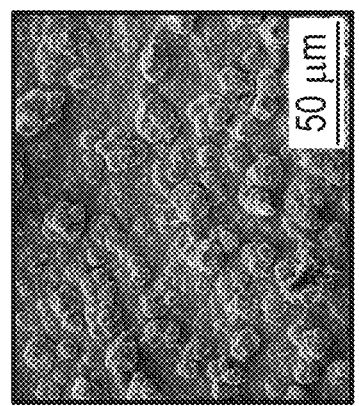
Figure 28A:
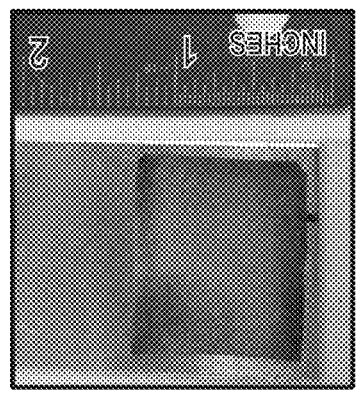

FIG. 28A-28C depict a typical example of an electrodeposited Cu/FBNNS nanocomposite containing PEG-Dithiol and SEM micrographs obtained from this nanocomposite (a) sample picture for 2 wt. % PEG-Dithiol addition; (b) low magnification SEM micrograph; and (c) low magnification SEM micrograph.

TABLE 9

| PEG-dithiol (wt %) | 0 | 1 | 2 |
|---|---|---|---|
| Thermal Conductivity (w/m · K) | 282.1 | 253.6 | 270.5 |

Figure 29:
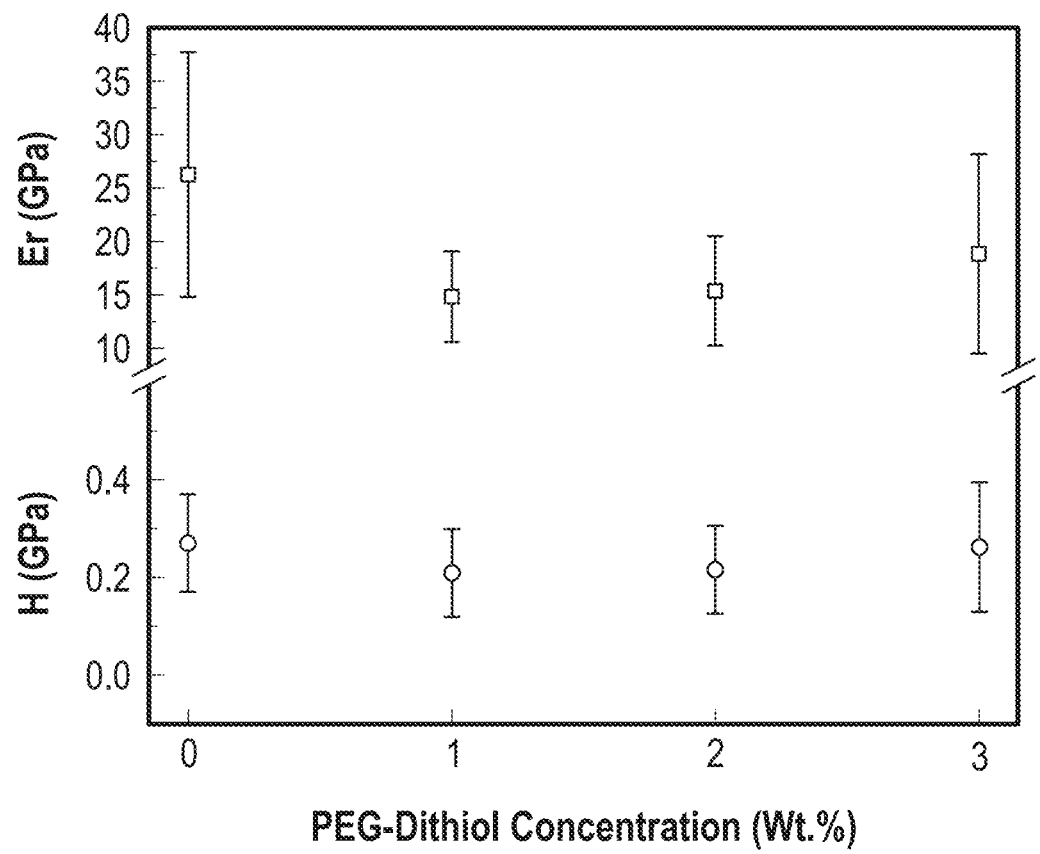
FIG. 29 depicts the effects of PEG-dithiol concentration reduced modulus for $E_r$ and H.

FIG. 29 depicts the effects of PEG-dithiol concentration reduced modulus for $E_r$ and hardness for H.

By neglecting contact resistance:

$$R_{Tot} = R_{c1} + \frac{BLT}{k_{TIM}} + R_{c2}$$

$$R_{Tot} \approx \frac{20 \cdot 10^{-6} \text{m}}{250 \text{ W/m} \cdot \text{K}} = 8 \times 10^{-8} \frac{\text{m}^2\text{K}}{\text{W}} = 8 \times 10^{-4} \frac{\text{cm}^2\text{K}}{\text{W}}$$

By estimating contact resistance:

$$R_{C1} \approx 1/h_c = 4200 \, k_c R_a^{-0.257} \left(\frac{P}{H}\right)^{0.95}$$

For a thickness of 20 μm, surface roughness of 0.1-0.5 μm, and the contact pressure of 100 Mpa.

$$h_c = 4200 * 250 * (10^{-7})^{-.257} \left(\frac{0.1}{0.275}\right)^{0.95} = 2.53 \times 10^7 \frac{\text{W}}{\text{m}^2\text{K}}$$

$$R_{Tot} = 2 * 3.95 \times 10^{-8} + 8 \times 10^{-8} \frac{\text{m}^2\text{K}}{\text{W}} = 1.59 \times 10^{-3} \frac{\text{cm}^2\text{K}}{\text{W}}$$

For a thickness of 50 μm.

$$R_{Tot} = (2 * 3.95 \times 10^{-8} + 20 \times 10^{-8}) \frac{\text{m}^2\text{K}}{\text{W}} = 2.79 \times 10^{-3} \frac{\text{cm}^2\text{K}}{\text{W}}$$

An electrocodeposition approach has been developed. Functional of BNNS was used to prepare robust nanocomposites. Thermal conductivities great than 250 W/K·m and elastic modulus values less than 20 GPa can be produced.

Figure 30:
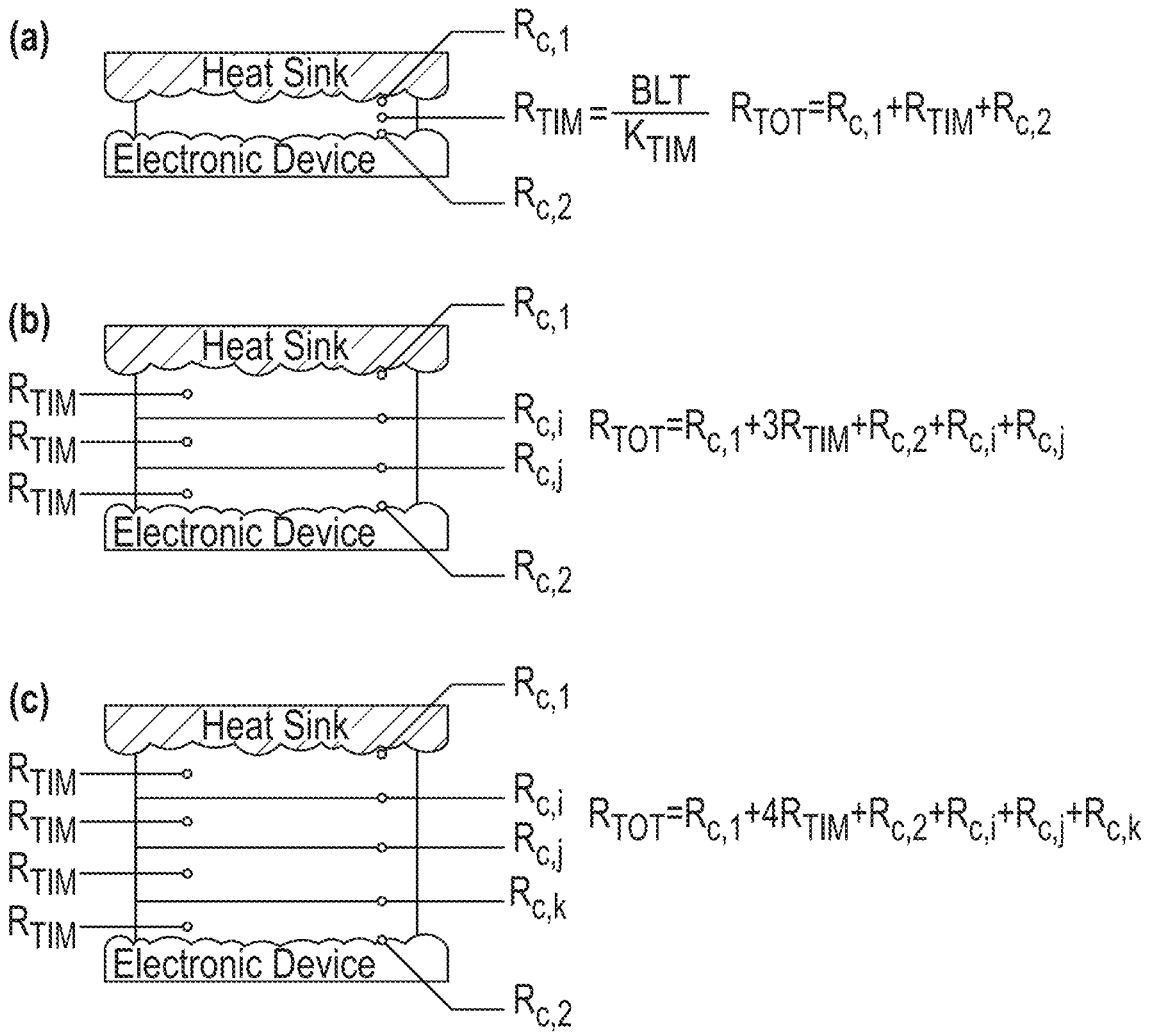
FIG. 30A-30C depicts diagrams and equations for out-of-plane measurements.

FIG. 30 depicts diagrams and equations for out-of-plane measurements.

Figure 31:
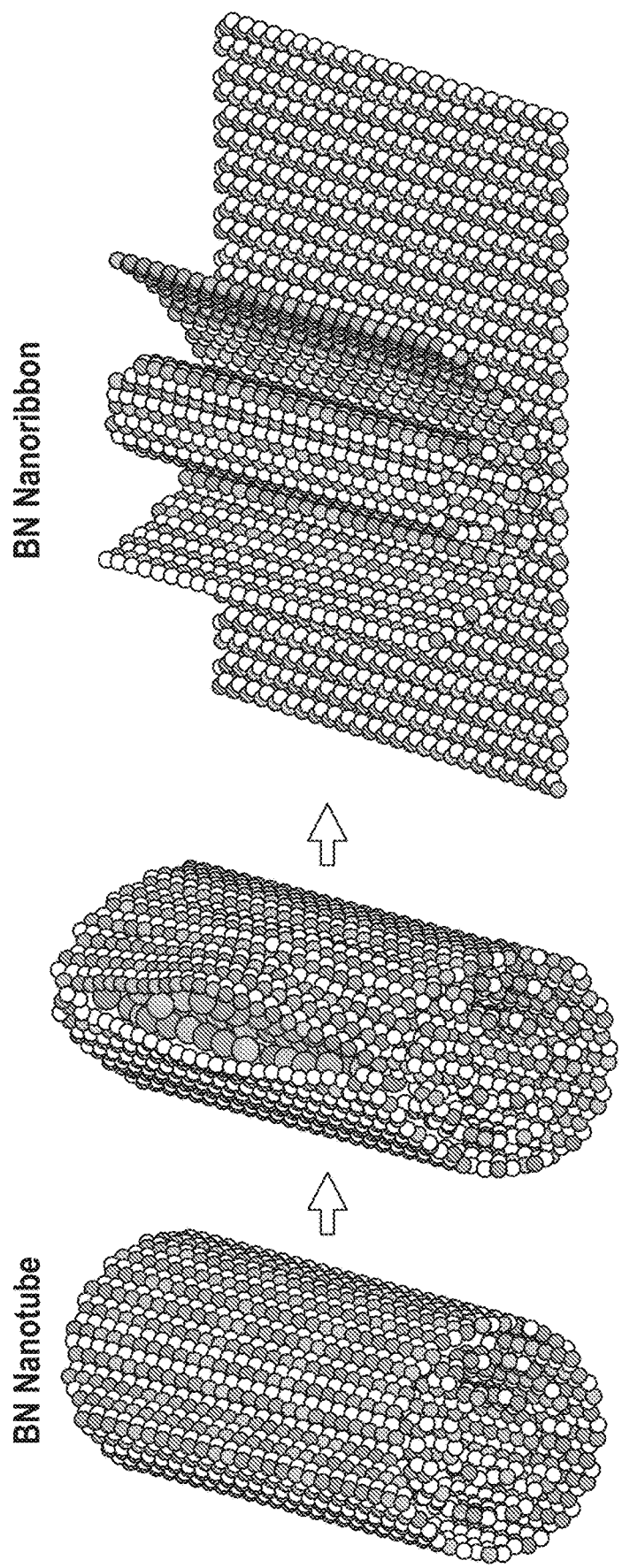
FIG. 31 depicts that BN nanoribbons can be used as a filler. (Adapted from Kris et al.).

FIG. 31 depicts that other fill BN nanoribbons can be used.

Figure 32:
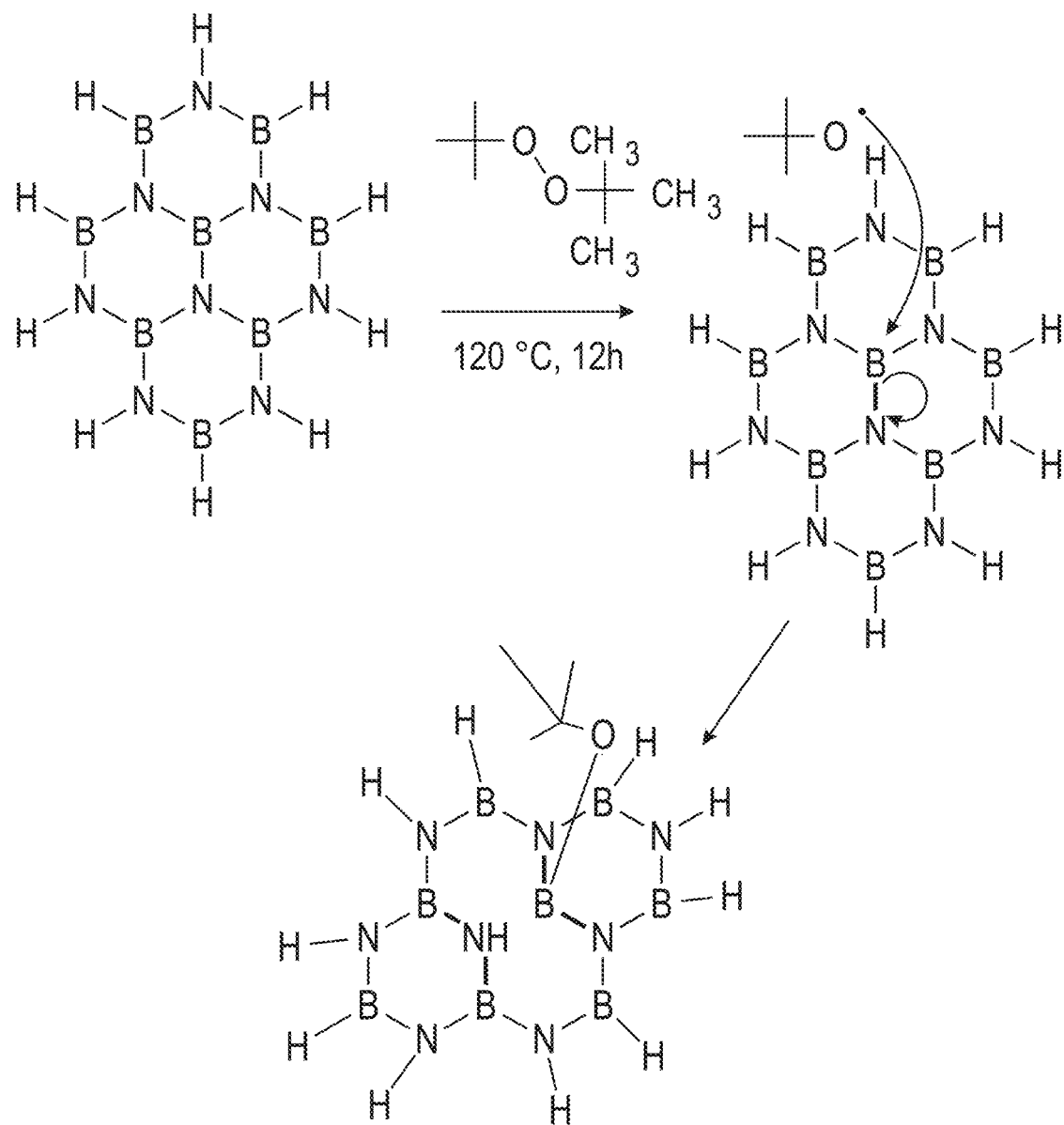
FIG. 32 depicts that other ligands can be used to functionalize BNNS. (Adapted from Sainsbury et al.).

FIG. 32 depicts that other ligands can be used to functionalize BNNS, including but not limited to tert-butoxy radical functionalization of BNNS.

Figure 33:
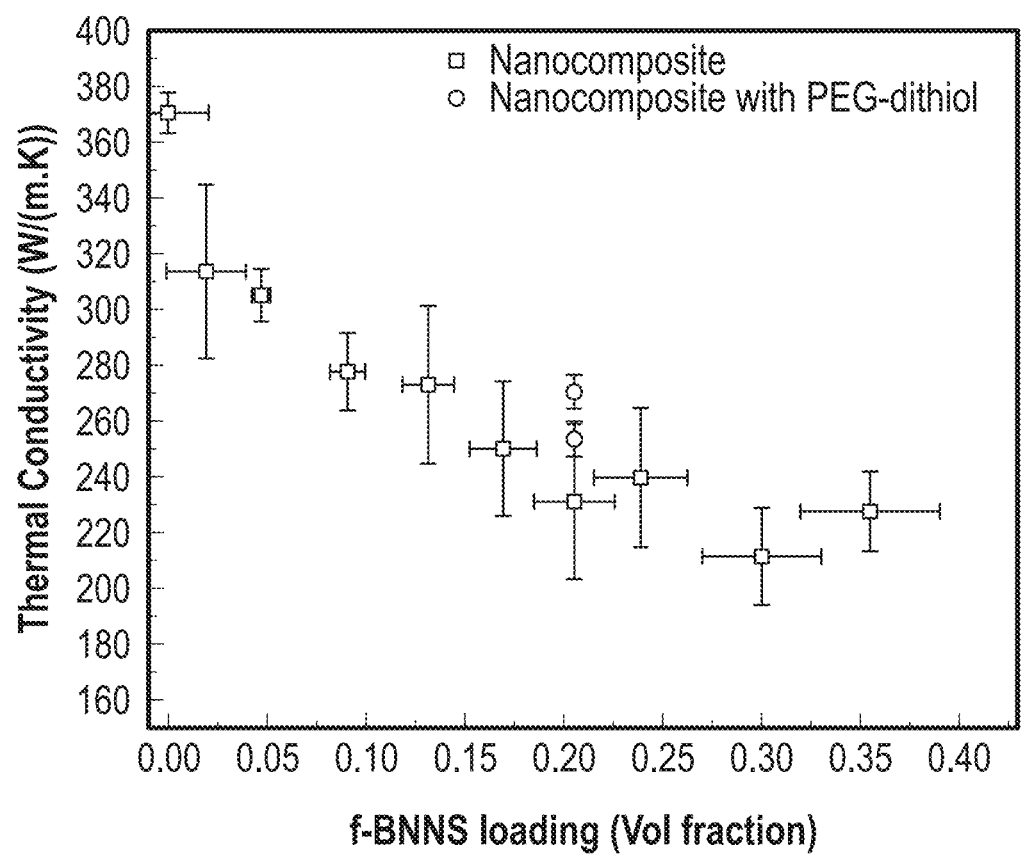
FIG. 33 depicts the trend of thermal conductivity for varying f-BNNS loading.

FIG. 33 depicts the thermal properties of the developed TIM.

Other metals that can be used for the metal matrix, include but are not limited to, silver and indium.

All of the compositions and methods disclosed and claimed herein can be made and executed without undue experimentation in light of the present disclosure. While the compositions and methods of this disclosure have been described in terms of preferred embodiments, it will be apparent to those of skill in the art that variations can be applied to the compositions and methods and in the steps or in the sequence of steps of the methods described herein without departing from the concept, spirit and scope of the disclosure. More specifically, it will be apparent that certain agents which are both chemically related can be substituted for the agents described herein while the same or similar results would be achieved. All such similar substitutes and modifications apparent to those skilled in the art are deemed to be within the spirit, scope and concept of the disclosure as defined by the appended claims.

REFERENCES

Booth, R. B.; Grube, G. W.; Gruber, P. A.; Khandros, I. Y.; Zingher, A. R.: Liquid metal matrix thermal paste. U.S. Pat. No. 5,198,189 (1993).

Cengiz Yegin, Nirup Nagabandi, Mustafa Akbulut, Effect of time, concentration, temperature and current density on electro-deposition of metal-organic-inorganic nanocomposites, October 2015 (in preparation).

Cengiz Yegin, Nirup Nagabandi, Mustafa Akbulut, Enhanced mechanical and thermal properties of metal-inorganic-organic nanocomposite thermal interface materials involving electrodeposition of copper and functionalized boron nitride nanosheets, TBD, January 2015.

Davison, P. A.; Koning, P. A.: Component packaging apparatus, systems, and methods. US-Patent Publ. No. 20050116387 (2005).

Dolbear, T. P.; Mackay, C. A.; Nelson, R. D.: Liquid metal paste for thermal and electrical connections. US, 1992.

Fabris, D.; Rosshirt, M.; Cardenas, C.; Wilhite, P.; Yamada, T.; Yang, C. Y., Journal of Electronic Packaging 2011, 133, 020902-6.

Gradzielski, M., Langevin, D., & Farago, B. (1996). Experimental investigation of the structure of nonionic microemulsions and their relation to the bending elasticity of the amphiphilic film. Physical Review E., 53 (4), 3900.

Gwinn, J. P.; Webb, R. L., Microelectronics Journal 2003, 34, 215-222.

Huang, H.; Wu, Y.; Liu, C. H.; Fan, S. S.: Method for making a thermal interface material. U.S. Pat. No. 7,393,428 (2008).

Jochen Greim, Karl A. Schwetz (2005). "Boron Carbide, Boron Nitride, and Metal Borides". Ullmann's Encyclopedia of Industrial Chemistry. Weinheim: Wiley-VCH.

Kang, S. K.; Purushothaman, S.; Simonyi, E. E.: Thermally conducting materials and applications for microelectronic packaging. U.S. Pat. No. 6,114,413 (2000).

Marconnet, A. M.; Yamamoto, N.; Panzer, M. A.; Wardle, B. L.; Goodson, K. E, ACS Nano 2011, 5, 4818-4825.

Matayabas Jr, J. C.; Koning, P. A.: Phase change thermal interface materials including polyester resin. U.S. Pat. No. 7,408,787 (2008).

Nan et al. The thermal stability of graphene in air investigated by Raman spectroscopy, Journal of Raman Spectroscopy, 2013, 44(7), 1018-1021.

Nguyen, M. L., Le, K. C.: Thermal interface materials. U.S. Pat. No. 6,797,382 (2004).

Nirup Nagabandi, Cengiz Yegin, Mustafa Akbulut, Effect of ligands on functionalization of hexagonal boron nitride nanosheets involved in TIMs preparation with BNNS dispersion in metal matrix, TBD, May 2015 (in preparation).

Nirup Nagabandi, Cengiz Yegin, Mustafa Akbulut, TIMs involving nanocomposites of Silver-BN-ligand with several ligands, TBD, December 2015-January 2016 (in preparation).

Rabinovich et al., Mechanical and thermodynamic properties of surfactant aggregates at the solid-liquid interface, Journal of colloid and interface science, 2004 270(1), 29-36.

Sainsbury et al., Covalently functionalized hexagonal boron nitride nanosheets by nitrene addition. Chemistry-A European Journal, 2012, 18(35), 10808-10812.

Sainsbury et al., Oxygen radical functionalization of boron nitride nanosheets. Journal of the American Chemical Society, 2012, 134(45), 18758-18771.

Shahil, K. M. F.; Balandin, A. A., Nano Letters 2012, 12, 861-867.

Xu, Y.; Leong, C.-K.; Chung, D. D. L., Journal of Electronic Materials 2007, 36, 1181-1187.

Yu, A.; Ramesh, P.; Itkis, M. E.; Bekyarova, E.; Haddon, R. C., The Journal of Physical Chemistry C 2007, 111, 7565-7569.

Yu, H.; Li, L.; Kido, T.; Xi, G.; Xu, G.; Guo, F., Journal of Applied Polymer Science 2012, 124, 669-677.

Zan et al. "Interaction of metals with suspended graphene observed by transmission electron microscopy." The Journal of Physical Chemistry Letters 2012, 3 (7), 953-958.

Kris J. Erickson, Ashley L. Gibb, Alexander Sinitskii, Michael Rousseas, Nasim Alem, James M. Tour, and Alex K. Zettl. "Longitudinal Splitting of Boron Nitride Nanotubes for the Facile Synthesis of High Quality Boron Nitride Nanoribbons." Nano Lett. 2011, 11, 3221-3226

What is claimed is:

1. A thermal interface material, comprising:
a plurality of soft-ligand functionalized boron nitride nanosheets present in a metal matrix, wherein the soft-ligand functionalized boron nitride nanosheets are kinetically trapped in the metal matrix, wherein the metal matrix is selected from the group consisting of copper, silver and indium, the soft-ligand includes at least one selected from the group consisting of dithiol ligands, tert-butoxy radicals, thiosemicarbazide, adipic acid dihydrazide, terepthalic dihydrazide, and dodecanedioic dihydrazide, and the thermal interface material exhibits a thermal conductivity greater than 250 W/K·m and an elastic modulus value less than 20 GPa.

2. The thermal interface material of claim 1, wherein the soft-ligands include at least one selected from the group consisting of thiosemicarbazide, adipic acid dihydrazide, terepthalic dihydrazide, and dodecanedioic dihydrazide.

3. The thermal interface material of claim 1, wherein the metal matrix is copper.

4. The thermal interface material of claim 1, wherein the thermal interface material is applied in a heat generating electronic instrument.

5. The thermal interface material of claim 4, where the thermal interface material is provided in a thermal gap in the heat generating electronic instrument.

6. The thermal interface material of claim 4, wherein the thermal interface material is coated on a chip within the heat generating electronic instrument.

7. A method of manufacturing a thermal interface material, comprising:
incorporating a plurality of soft-ligand functionalized boron nitride nanosheets in a metal matrix using electrodeposition, wherein the soft-ligand functionalized boron nitride nanosheets are kinetically trapped in the metal matrix, wherein the metal matrix is selected from the group consisting of copper, silver or indium, the soft-ligand includes at least one selected from the group consisting of dithiol ligands, tert-butoxy radicals, thiosemicarbazide, adipic acid dihydrazide, terepthalic dihydrazide, and dodecanedioic dihydrazide, and the thermal interface material exhibits a thermal conductivity greater than 250 W/K·m and an elastic modulus value less than 20 GPa.

8. The method of manufacturing of claim 7 wherein the metal matrix is copper.

9. The method of manufacturing of claim 8 wherein the plurality of soft-ligand functionalized boron nitride nanosheets are dispersed in the copper metal matrix using electrocodeposition.

10. The method of claim 7, further comprising cleaving h-boron nitride flakes through ultrasonication in dimethylformamide to form a plurality of boron nitride nanosheets and functionalizing the plurality of boron nitride nanosheets with a soft-ligand to form the plurality of soft-ligand functionalized boron nitride nanosheets.

11. The method of claim 7, further comprising functionalizing a plurality of boron nitride nanosheets with a soft-ligand through Lewis acid-base interactions to form the plurality of soft-ligand functionalized boron nitride nanosheets.

12. The method of claim 7, wherein electrocodeposition is performed in a solution including hydrogen sulfate and N-methyl-2-pyrrolidone.

13. A method of using a thermal interface material, comprising:
generating heat in an electronic instrument wherein a thermal interface material is deposited on the electronic instrument; and
cooling the electronic instrument with the thermal interface material, wherein the thermal interface material includes a plurality of soft-ligand functionalized boron nitride nanosheets present in a metal matrix, wherein the soft-ligand functionalized boron nitride nanosheets are kinetically trapped in the metal matrix, wherein the metal matrix is selected from the group consisting of copper, silver and indium, the soft ligand includes at least one selected from the group consisting of dithiol ligands, tert-butoxy radicals, thiosemicarbazide, adipic acid dihydrazide, terepthalic dihydrazide, and dodecanedioic dihydrazide, and the thermal interface material exhibits a thermal conductivity greater than 250 W/K·m and an elastic modulus value less than 20 GPa.

14. The method of using the thermal interface material of claim 13, wherein cooling is by dissipating heat via the thermal interface material in the electronic instrument.

15. The method of using the thermal interface material of claim 13, wherein the thermal interface material is a thermal gap filler.

16. The method of using the thermal interface material of claim 13, further comprising coating the thermal interface material on a chip and placing the chip within the electronic instrument.

* * * * *